(12) United States Patent
Kohda

(10) Patent No.: US 9,000,304 B2
(45) Date of Patent: Apr. 7, 2015

(54) SEALING MEMBER FOR PIEZOELECTRIC RESONATOR DEVICE AND PIEOELECTRIC RESONATOR DEVICE

(75) Inventor: Naoki Kohda, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 152 days.

(21) Appl. No.: 13/237,145

(22) Filed: Sep. 20, 2011

(65) Prior Publication Data

US 2012/0067611 A1     Mar. 22, 2012

(30) Foreign Application Priority Data

Sep. 21, 2010    (JP) ................................. 2010-211045

(51) Int. Cl.
| | |
|---|---|
| H05K 1/16 | (2006.01) |
| H03H 9/10 | (2006.01) |
| B81B 7/00 | (2006.01) |
| H01L 23/13 | (2006.01) |

(Continued)

(52) U.S. Cl.
CPC .............. *H03H 9/1021* (2013.01); *B81B 7/007* (2013.01); *H01L 23/13* (2013.01); *H01L 23/15* (2013.01); *H01L 23/49827* (2013.01); *H01L 23/49838* (2013.01); *B81B 2207/096* (2013.01); *H03H 9/21* (2013.01); *H01L 2924/0002* (2013.01)

(58) Field of Classification Search
CPC .................... H01L 41/22; H01L 2924/01079; H01L 2924/01078; H01L 23/10; H01L 2924/16152; H01L 41/053; F03G 7/005; H03H 9/1021; H03H 9/1014; H03H 9/48; H03H 9/46; H03H 3/02; H03H 9/1007; H03B 5/30; H03B 17/00; H05K 3/4046; H05K 1/112

USPC ......... 174/255, 260, 265, 50.5; 331/155, 156; 333/200; 310/311, 344, 340
See application file for complete search history.

(56) References Cited

U.S. PATENT DOCUMENTS

| | | | |
|---|---|---|---|
| 6,555,756 B2 * | 4/2003 | Nakamura et al. ............ 174/255 |
| 6,591,495 B2 * | 7/2003 | Hirose et al. ..................... 29/846 |

(Continued)

FOREIGN PATENT DOCUMENTS

| | | |
|---|---|---|
| EP | 1635457 A2 | 3/2006 |
| JP | H05-121989 A | 5/1993 |

(Continued)

OTHER PUBLICATIONS

JP 2006295246 A English translation.*

(Continued)

*Primary Examiner* — Yuriy Semenenko
*Assistant Examiner* — Pete Lee
(74) *Attorney, Agent, or Firm* — Marvin A. Motsenbocker; Mots Law, PLLC

(57) ABSTRACT

A sealing member for an electronic component package includes, on another principal surface of a base material constituting the sealing member for the electronic component package, an external terminal electrode, a wiring pattern, and a resin material. The external terminal electrode is to be electrically coupled to an outside of the electronic component package. The wiring pattern is configured to couple an electronic component element on one principal surface of the base material to the external terminal electrode. The resin material is layered over the other principal surface and the wiring pattern. The external terminal electrode is layered over the wiring pattern and the resin material.

7 Claims, 20 Drawing Sheets

(51) Int. Cl.
*H01L 23/15* (2006.01)
*H01L 23/498* (2006.01)
*H03H 9/21* (2006.01)

(56) References Cited

U.S. PATENT DOCUMENTS

| | | | |
|---|---|---|---|
| 7,266,869 B2 * | 9/2007 | Hatanaka et al. | 29/25.35 |
| 7,358,652 B2 * | 4/2008 | Aratake et al. | 310/340 |
| 7,605,521 B2 * | 10/2009 | Kuwahara | 310/344 |
| 7,791,421 B2 * | 9/2010 | Yamashita | 331/68 |
| 8,179,021 B2 * | 5/2012 | Fukuda | 310/344 |
| 2006/0055013 A1 * | 3/2006 | Ito et al. | 257/678 |
| 2008/0266003 A1 * | 10/2008 | Yamashita | 331/68 |
| 2009/0309218 A1 * | 12/2009 | Kawashita et al. | 257/737 |
| 2010/0134993 A1 | 6/2010 | Ito et al. | |
| 2010/0288550 A1 * | 11/2010 | Nagamatsu et al. | 174/262 |
| 2010/0295421 A1 | 11/2010 | Takeuchi et al. | |
| 2012/0261815 A1 | 10/2012 | Ito et al. | |

FOREIGN PATENT DOCUMENTS

| | | |
|---|---|---|
| JP | 2006-109400 A | 4/2006 |
| JP | 2009-194091 A | 8/2009 |
| JP | 2010-103479 A | 5/2010 |
| WO | 2009/041159 A1 | 4/2009 |

OTHER PUBLICATIONS

JP2006295246A English Translation published in Oct. 26, 2006.*
European search report issued on Nov. 12, 2014 in the counterpart European patent application.

* cited by examiner

SEALING MEMBER FOR PIEZOELECTRIC RESONATOR DEVICE AND PIEOELECTRIC RESONATOR DEVICE

CROSS-REFERENCE TO RELATED APPLICATIONS

The present application claims priority under 35 U.S.C. 119(a) to Japanese Patent Application No. 2010-211045, filed Sep. 21, 2010. The contents of this application are incorporated herein by reference in their entirety.

BACKGROUND OF THE INVENTION

1. Field of the Invention

The present invention relates to a sealing member for an electronic component package that includes a first sealing member and an opposing second sealing member to hermetically enclose an electrode of an electronic component element, the sealing member being applicable to the first sealing member. The present invention also relates to an electronic component package that uses the sealing member.

2. Discussion of the Background

The packages of electronic components (hereinafter referred to as electronic component packages) such as piezoelectric resonator devices have their internal spaces hermetically enclosed in order to prevent property degradation of the electrodes of the electronic component elements mounted in the internal spaces.

An electronic component package of this kind includes two sealing members such as a base and a lid. The base and the lid define a package in the form of a rectangular parallelepiped. In the internal space of the electronic component package, an electronic component element such as a piezoelectric resonator plate is bonded to and held by the base. The bonding of the base and the lid hermetically encloses the electrodes of the electronic component element in the internal space of the electronic component package.

For example, Japanese Unexamined Patent Application Publication No. 6-283951 (hereinafter referred to as patent document 1) discloses a crystal component (an electronic component of the present invention) that includes an electronic component package defined by the base and the lid. In the internal space of the electronic component package, a crystal plate is hermetically enclosed. The crystal component includes a base that has through holes passing through the base material of the base. Each through hole includes, on its internal surface, a wiring metal made of a multiple-layer metal film such as Cr—Ni—Au. Each through hole further includes an alloy such as Au—Ge welded therein, thus securing air tightness of the internal space of the electronic component package.

Incidentally, such electronic components are subjected to heat when mounted on boards such as printed circuit boards, which involves the following problems. In the crystal component disclosed in patent document 1, the heat applied to the crystal component when mounted on the board can cause softening (diffusion) of the boundary between the internal surface of the through hole and the alloy attached to the internal surface, degrading the adherence between the alloy and the internal surface of the through hole. The degraded adherence of the alloy causes detachment of the alloy off the internal surface of the through hole, and the detached alloy can drop outside the electronic component package of the crystal component. The dropping of the alloy out of the through hole leads to degraded air tightness of the internal space of the electronic component package.

In order to ensure enough air tightness in the internal space of the electronic component package, the inventor invented a sealing technique of filling the through hole with a conducting material (metal) to serve as a part of the wiring pattern, and of sealing the opening face of the through hole at the side of the other principal surface with a resin material. Unfortunately, a problem arises in that the adhesion strength of the resin with respect to the base can degrade in some cases.

Specifically, a wiring pattern made of metal is disposed on the rear surface (the other principal surface) of the base. Hence, the resin material to hermetically enclose the through hole is disposed not only over the other principal surface (a blank surface) of the base but also over the wiring pattern formed on the other principal surface.

Resin materials (especially highly heat resistant resins, which are highly heat resistant) have weakness in adhesion strength (adhesiveness) with respect to Cu and precious metals (such as Au). Hence, the adhesion strength (adhesiveness) is poor between the resin material and the conducting material, which can cause detachment of the resin material off the conducting material, such as the wiring pattern. This can cause a possibility of degradation of air tightness in the internal space of the electronic component package.

The present invention has been made in view of the above-described circumstances, and it is an object of the present invention to provide a sealing member for an electronic component package that minimizes the degradation of air tightness of the internal space of the electronic component package even when a resin material is adopted on the other principal surface of the sealing member for the electronic component package for the purpose of hermetically enclosing the internal space of the electronic component package, and to provide an electronic component package.

SUMMARY OF THE INVENTION

According to one aspect of the present invention, a sealing member is for an electronic component package. The electronic component package includes a first sealing member and a second sealing member. The first sealing member has one principal surface on which an electronic component element is to be mounted. The first sealing member serves as the sealing member. The second sealing member is opposite the first sealing member. The second sealing member hermetically encloses an electrode of the electronic component element. The sealing member includes, on another principal surface of a base material constituting the sealing member for the electronic component package, an external terminal electrode, a wiring pattern, and a resin material. The external terminal electrode is to be electrically coupled to an outside of the electronic component package. The wiring pattern is configured to couple the electronic component element on the one principal surface to the external terminal electrode. The resin material is layered over the other principal surface and the wiring pattern. The external terminal electrode is layered over the wiring pattern and the resin material.

The embodiment of the present invention minimizes the degradation of air tightness in the internal space of the electronic component package even when a resin material is adopted on the other principal surface of the base material for the purpose of hermetically enclosing the internal space. Specifically, the resin material is layered over the base material at the other principal surface and the wiring pattern, and the external terminal electrode is layered over the wiring pattern and the resin material. Even if the adhesion strength of the resin material with respect to the wiring pattern is poor, the adhesion of the resin material to the base material and the adhesion of the external terminal electrode to the wiring pattern provide a complement to the adhesion of the resin material to the base material.

Incidentally, when electronic component packages are bonded on printed circuit boards, a solder (lead-free solder) is used to bond sealing members for the electronic component packages on the printed circuit boards. The solder contains Sn as a main component. Hence, when an electronic component package is bonded on the printed circuit board, the Sn of the solder can enter the internal space of the electronic component package through a wiring pattern and a through hole of the sealing member for the electronic component package. In view of this, with the sealing member for an electronic component package according to the embodiment of the present invention, the external terminal electrode, the wiring pattern, and the resin material are disposed on the other principal surface of the base material, and the resin material is layered over the base material at the other principal surface and the wiring pattern. This ensures that the resin material prevents the Sn of the solder from entering the internal space of the electronic component package. This, as a result, keeps the internal space of the electronic component package under vacuum.

In the above configuration, the external terminal electrode may be layered over the wiring pattern at a peripheral area along and lateral to a peripheral edge of a part of a layered portion of the resin material where the external terminal electrode is layered.

The external terminal electrode is layered over the wiring pattern at a peripheral area along and lateral to a peripheral edge of a part of a layered portion of the resin material where the external terminal electrode is layered. This is preferred for the bonding of the resin material to the base material in that the layering of the external terminal electrode over the wiring pattern is in a manner to surround a part of the layered portion of the resin material where the external terminal electrode is layered. This configuration also increases the distance between the wiring pattern and the external terminal electrode, thereby preventing the Sn of the solder from entering the internal space of the electronic component package.

In the above configuration, a conducting material may fill at least one through hole passing through between both principal surfaces of the base material. An open end portion of the at least one through hole at a side of the other principal surface (the opposite side of the mounting surface of the electronic component element) may be sealed with the resin material.

The resin material seals the opening face of the at least one through hole at the side of the other principal surface passing through both principal surfaces of the base material. This minimizes detachment of the conducting material filling the at least one through hole and minimizes dropping of the conducting material out of the at least one through hole. Additionally, the resin material sealing the opening face of the at least one through hole at the side of the other principal surface blocks heat conduction from the other principal surface to the conducting material filling the at least one through hole. This minimizes degradation of the adherence between the conducting material and the base material constituting the sealing member for the electronic component package, in spite of, for example, heat associated with mounting of the electronic component package on the board. This in turn minimizes degradation of air tightness in the internal space.

According to another aspect of the present invention, an electronic component package includes a first sealing member and a second sealing member. The first sealing member has one principal surface on which an electronic component element is to be mounted. The second sealing member is opposite the first sealing member. The second sealing member hermetically encloses an electrode of the electronic component element. The first sealing member includes the sealing member for an electronic component package according to the one aspect of the present invention.

With this configuration, the sealing member for an electronic component package according to the one aspect of the present invention is used as the first sealing member. This results in similar advantageous effects to those of the sealing member for an electronic component package according to the one aspect of the present invention. This minimizes the degradation of air tightness in the internal space of the electronic component package even if a resin material is adopted on the other principal surface of the base material for the purpose of hermetically enclosing the internal space.

BRIEF DESCRIPTION OF THE DRAWINGS

FIG. 5 is a schematic rear view of the base shown in FIG. 14.

DESCRIPTION OF THE REFERENCE NUMERAL

Figure 1:
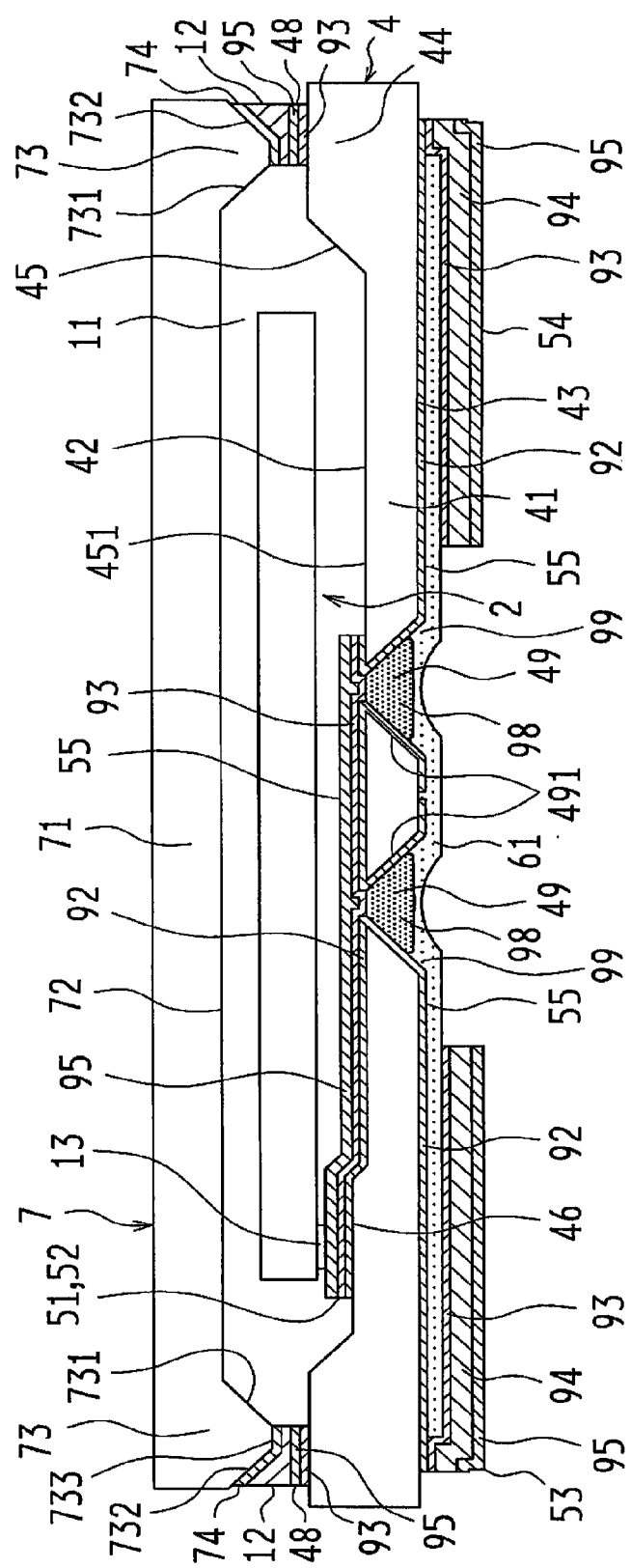
FIG. 1 is a schematic cross-sectional view of a crystal resonator according to an embodiment of the present invention taken along the line A-A of a base shown in FIG. 2, for schematically illustrating an internal space of the crystal resonator.

1 Crystal resonator
11 Internal space
12 Bonding material
13 Conductive bump
2 Crystal resonator plate (electronic component element)
20 Piezoelectric resonator blank
21, 22 Leg portion
211, 221 Distal end portion
23 Base portion
231 One end face
232 The other end face
233 Side face
24 Bonding portion
241 Shorter side portion
242 Longer side portion
243 Distal end portion
25 Groove portion
26 Through hole
27 Bonding point
31, 32 Excitation electrode
33, 34 Extraction electrode
4 Base (sealing member for an electronic component package as a first sealing member)
41 Bottom portion
42 One principal surface
43 The other principal surface
44 Wall portion
45 Cavity
452 One end portion
46 Pedestal portion
47 Resin pattern formed area
471 Longer side
472 Shorter side
473, 474 End portion
48 First bonding layer
49 Through hole
491 Internal surface
492 One end opening face
493 The other end opening face
51, 52 Electrode pad
53, 54 External terminal electrode
541 Cut-out portion
532, 542 Extending portion
55 Wiring pattern
551 Periphery portion
552 Area
553 Tapered portion
554 Wiring pattern portion
56 Getter film
58, 59 Contact area
61 Resin pattern
611 Concave portion
612 Tapered portion
613 Part
7 Lid (second sealing member)
71 Top portion
72 One principal surface
73 Wall portion
731 Internal surface 732 Outer surface
733 Top face
74 Second bonding layer
76 Getter film
8 Wafer
81, 82 Principal surface
92 First seed film (first metal layer)
93 Second seed film (second metal layer)
94 First plated film (first plated layer)
95 Second plated film (second plated layer)
96 Resin layer
97 Positive resist layer
98 Infill layer
981 One end face
982 The other end face
99 Gap Description Of The Embodiments Embodiments of the present invention will be described below by referring to the accompanying drawings. In the following embodiments, the present invention is applied to a package of a crystal resonator, which is a piezoelectric resonator device, as an electronic component package. The present invention is also applied to a tuning-fork crystal resonator plate, which is a piezoelectric resonator plate, as an electronic component element.

Figure 6:
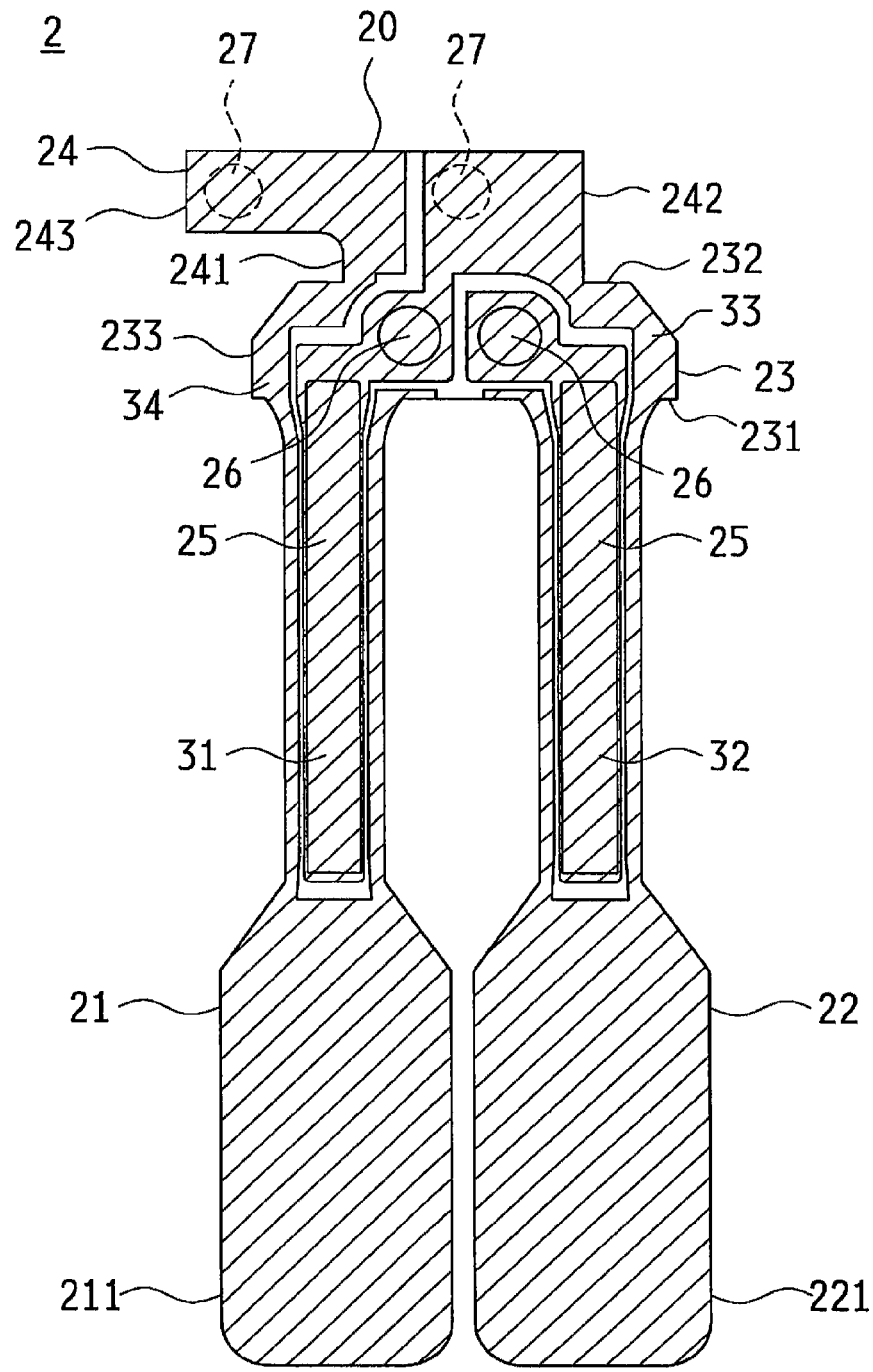
FIG. 6 is a schematic plan view of a crystal resonator plate according to the embodiment of the present invention.

As shown in FIG. 1, the crystal resonator 1 according to this embodiment of the present invention includes a crystal resonator plate 2 (an electronic component element of the present invention) shown in FIG. 6, a base 4 (a sealing member for an electronic component package as a first sealing member of the present invention), and a lid 7 (a second sealing member of the present invention). The crystal resonator plate 2 is made of a tuning-fork crystal resonator plate. The base 4 holds and hermetically encloses the crystal resonator plate 2. The lid 7 is disposed opposite the base 4 and hermetically encloses excitation electrodes 31 and 32 (electrodes shown in FIG. 6 and electrodes of the electronic component element of the present invention) of the crystal resonator plate 2 held on the base 4.

The crystal resonator 1 includes the base 4 and the lid 7. The base 4 and the lid 7 are bonded to each other with a bonding material 12 made of a Au—Sn alloy, a first bonding layer 48 described below, and a second bonding layer 74 described below. The bonding results in a main casing defining a hermetically enclosed internal space 11. In the internal space 11, the crystal resonator plate 2 is electrically and mechanically bonded to the base 4 by ultrasonic bonding of Flip Chip Bonding (FCB) with a conductive bump 13 such as gold bump. In this embodiment, the conductive bump 13 used is a bump plating made of a non-liquid member such as a gold bump.

Next, the constituents of the crystal resonator 1 will be described below.

Figure 2:
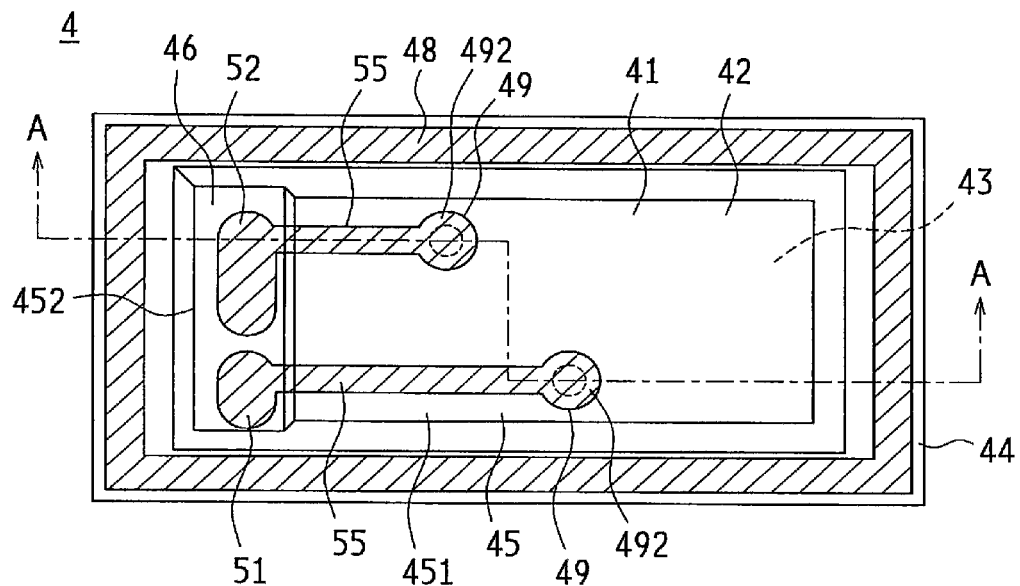
FIG. 2 is a schematic plan view of the base according to the embodiment of the present invention.
Figure 3:
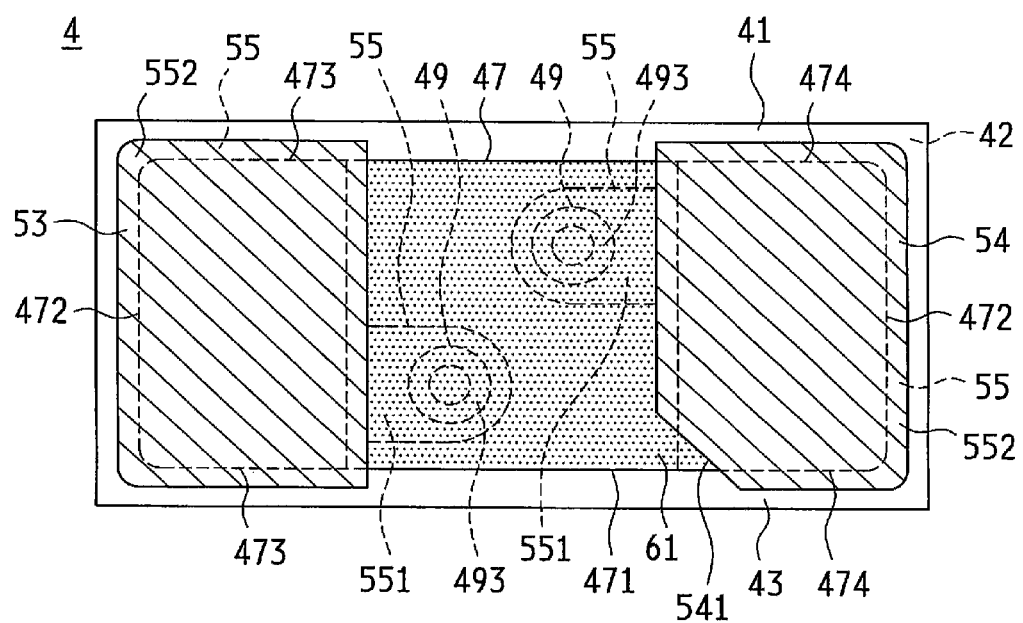
FIG. 3 is a schematic rear view of the base according to the embodiment of the present invention.

The base 4 is made of glass material such as borosilicate glass. As shown in FIGS. 1 to 3, the base 4 is in the form of a box including a bottom portion 41 and a wall portion 44 that extends upward from the bottom portion 41 along an outer periphery of one principal surface 42 of the base 4. To form the base 4 into this box shape, a base material of a rectangular parallelepiped single plate is wet etched.

The internal surface of the wall portion 44 of base 4 has a tapered shape. The wall portion 44 has a top face serving as a bonding face for the lid 7, and the bonding face has a first bonding layer 48 for bonding with the lid 7. The first bonding layer 48 has a multiple-layer structure that includes: a sputtering film (see reference numeral 93 in FIG. 1) formed on the top face of the wall portion 44 of the base 4 by sputtering; and a plated film (see reference numeral 95 in FIG. 1) plated on the sputtering film (see reference numeral 93 in FIG. 1). The sputtering film (see reference numeral 93 in FIG. 1) includes a Ti film (not shown) formed on the top face of the wall portion 44 of the base 4 by sputtering and a Au film (not shown) formed on the Ti film by sputtering. The plated film (see reference numeral 95 in FIG. 1) includes a Au film plated on the sputtering film (see reference numeral 93 in FIG. 1).

The base 4 includes, on its one principal surface 42, a cavity 45 having a rectangular shape in plan view surrounded by the bottom portion 41 and the wall portion 44. The cavity 45 includes, on its bottom face 451, a pedestal portion 46 etched over the entire one end portion 452 in a longer side direction. The crystal resonator plate 2 is mounted on the pedestal portion 46. The wall face of the cavity 45 is the internal surface of the wall portion 44 and tapered as described above.

The base 4 includes a pair of electrode pads 51 and 52, external terminal electrodes 53 and 54, and a wiring pattern 55. The electrode pads 51 and 52 are electrically and mechanically coupled to the excitation electrodes 31 and 32, respectively, of the crystal resonator plate 2. The external terminal electrodes 53 and 54 are electrically coupled to an external part or an external device. The wiring pattern 55 electrically couples the electrode pad 51 to the external terminal electrode 54, and electrically couples the electrode pad 52 to the external terminal electrode 53. The electrode pads 51 and 52, the external terminal electrodes 53 and 54, and the wiring pattern 55 constitute an electrode 5 of the base 4. The electrode pads 51 and 52 are disposed on the surface of the pedestal portion 46. The two external terminal electrodes 53 and 54 are disposed on both sides of the other principal surface 43 of the base 4 and separated from one another in the longer side direction. The external terminal electrode 54 includes a cut-out portion 541 at one corner portion (one of the corner portions at the side facing the external terminal electrode 53). The cut-out portion 541 serves supporting functions such as positioning of the base in the production process of the crystal resonator 1 and positioning of the crystal resonator 1 when mounted on an external part or an external device.

The electrode pads 51 and 52 include a first seed film on a base material of the base 4 (see reference numeral 92 in FIG. 1), a second seed film (see reference numeral 93 in FIG. 1) on the first seed film (see reference numeral 92 in FIG. 1), and a second plated film (see reference numeral 95 in FIG. 1) on the second seed film (see reference numeral 93 in FIG. 1). The first seed film (see reference numeral 92 in FIG. 1) constituting the electrode pads 51 and 52 includes a Ti film (not shown) and a Cu film (not shown). The Ti film is formed on the one principal surface 42 of the base 4 by sputtering. The Cu film is formed on the Ti film by sputtering. The second seed film (see reference numeral 93 in FIG. 1) includes a Ti film (not shown) and a Au film (not shown). The Ti film is formed on the first seed film (see reference numeral 92 in FIG. 1) by sputtering. The Au film (not shown) is formed on the Ti film by sputtering. The second plated film (see reference numeral 95 in FIG. 1) includes a Au film plated on the second seed film (see reference numeral 93 in FIG. 1).

The wiring pattern 55 extends from the one principal surface 42 of the base 4 to the other principal surface 43 of the base 4 via internal surfaces 491 of through holes 49 (see below) so as to electrically couple the electrode pads 51 and 52 to the external terminal electrodes 53 and 54. The wiring pattern 55 includes a first seed film (see reference numeral 92 in FIG. 1) on the base material of the base 4. The second seed film (see reference numeral 93 in FIG. 1) and the second plated film (see reference numeral 95 in FIG. 1) made of Au are disposed on a part of the first seed film (see reference numeral 92 in FIG. 1) located at the one principal surface 42 of the base 4. The first seed film (see reference numeral 92 in FIG. 1) constituting the wiring pattern 55 includes a Ti film (not shown) and a Cu film (not shown). The Ti film is formed on the one principal surface 42 of the base 4 by sputtering. The Cu film is formed on the Ti film by sputtering. The second seed film (see reference numeral 93 in FIG. 1) includes a Ti film (not shown) and a Au film (not shown). The Ti film is formed on the first seed film (see reference numeral 92 in FIG. 1) by sputtering. The Au film is formed on the Ti film by sputtering. The second plated film (see reference numeral 95 in FIG. 1) includes a Au film plated on the second seed film (see reference numeral 93 in FIG. 1). It is noted that for viewability of the schematic cross-sectional view shown in FIG. 1, gaps are omitted between: a part of the wiring pattern 55 coupling the electrode pad 52 and the external terminal electrode 53 on the one principal surface 42 of the base 4; and another part of the wiring pattern 55 coupling the electrode pad 51 and the external terminal electrode 54. Similar omissions are made in the other schematic cross-sectional views and the schematic partial cross-sectional views.

The external terminal electrodes 53 and 54 include the second seed film (see reference numeral 93 in FIG. 1), a first plated film (see reference numeral 94 in FIG. 1), and the second plated film (see reference numeral 95 in FIG. 1). The second seed film (see reference numeral 93 in FIG. 1) is disposed on the resin pattern 61 (see below), which is made of resin, and on the wiring pattern 55 (see reference numeral 92 in FIG. 1) on the other principal surface 43 of the base 4. The first plated film (see reference numeral 94 in FIG. 1) is disposed on the second seed film (see reference numeral 93 in FIG. 1). The second plated film (see reference numeral 95 in FIG. 1) is disposed on the first plated film (see reference numeral 94 in FIG. 1). The seed film (see reference numeral 93 in FIG. 1) constituting the external terminal electrodes 53 and 54 includes a Ti film (not shown) and a Au film (not shown). The Ti film is formed on the resin pattern 61 and the wiring pattern 55 (see reference numeral 92 in FIG. 1) on the other principal surface 43 of the base 4 by sputtering. The Au film is formed on the Ti film by sputtering. The first plated film (see reference numeral 94 in FIG. 1) includes a Ni film plated on the second seed film (see reference numeral 93 in FIG. 1). The second plated film (see reference numeral 95 in FIG. 1) includes a Au film plated on the first plated film (see reference numeral 94 in FIG. 1).

As shown in FIGS. 1 to 4, the base 4 includes the through holes 49 through which the excitation electrodes 31 and 32 of the crystal resonator plate 2 are conducted from inside the cavity 45 to outside the cavity 45 by the wiring pattern 55 via the electrode pads 51 and 52.

Figure 4:
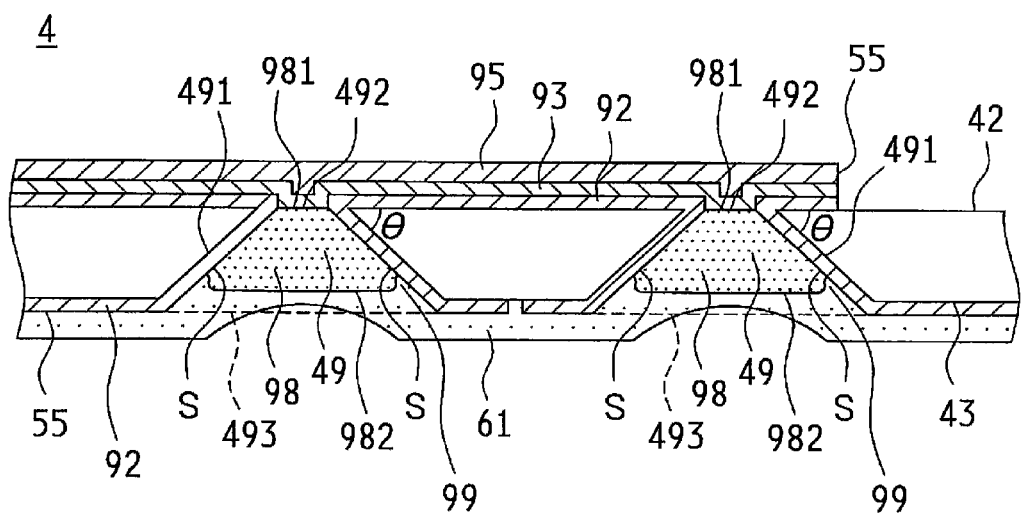
FIG. 4 is a schematic cross-sectional view of a through hole portion of the base shown in FIG. 1.

The through holes 49 are simultaneously formed with the cavity 45 at the time of etching of the base 4 by photolithography. As shown in FIGS. 1 to 4, the base 4 has two through holes 49 passing through between both principal surfaces 42 and 43 of the base 4. The through holes 49 have internal surfaces 491 that are inclined relative to the one principal surface 42 and the other principal surface 43 of the base 4, thus having tapered shapes. As shown in FIG. 4, the diameter of each through hole 49 is maximum at its other end opening face 493 at the side of the other principal surface 43 of the base 4 and minimal at one end opening face 492 at the side of the one principal surface 42 of the base 4. Thus, in this embodiment, the internal surfaces 491 of the through holes 49 are inclined relative to the one principal surface 42 and the other principal surface 43 of the base 4. Specifically, the angle defined by the one principal surface 42 of the base 4 and the internal surface 491 of each through hole 49 (see reference symbol $\theta$ in FIG. 4) is set at approximately 45 degrees. While in this embodiment the angle $\theta$ defined by the one principal surface 42 of the base 4 and the internal surface 491 of each through hole 49 is approximately 45 degrees, this should not be construed in a limiting sense. For example, the angle defined by the one principal surface 42 of the base 4 and the internal surface 491 of each through hole 49 may be more than 45 degrees, specifically 70 to 90 degrees. If the angle defined by the one principal surface 42 of the base 4 and the internal surface 491 of each through hole 49 (see reference symbol $\theta$ in FIG. 4) approaches 90 degrees, the through holes 49 occupy a smaller area on the base 4, which provides a greater freedom of choice on where to form the wiring pattern 55.

The internal surfaces 491 of the through holes 49 each include the first seed film (see reference numeral 92 in FIG. 1), which is made of Ti and Cu and is a part of the wiring pattern 55. The through holes 49 are filled with infills (conducting materials of the present invention) made of Cu on the first seed film (see reference numeral 92 in FIG. 1). The infills form infill layers 98 to seal the through holes 49. The infill layers 98 are made of Cu plated layers formed by electrolytic plating on the surface of the first seed film (see reference numeral 92 in FIG. 1). As shown in FIG. 4, the infill layers 98 each have one end face 981 at the side of the one principal surface 42 of the base 4. The one end face 981 is in flush with a surface 921 of the first seed film (see reference numeral 92 in FIG. 1) on the one principal surface 42 of the base 4. Each infill layer 98 also has another end face 982 at the side of the other principal surface 43. The other end face 982 is closer to the one principal surface 42 than the other end opening face 493 of each through hole 49 is to the one principal surface 42.

The other end opening faces 493 of the through holes 49 at the side of the other principal surface 43 of the base 4 are sealed with a resin pattern 61 made of a photosensitive resin material. While in this embodiment the resin pattern 61 is applied as the resin material, the resin pattern 61 should not be construed in a limiting sense. It is possible to use any other configuration that can be used on the other principal surface 43 of the base 4 to hermetically enclose the internal space 11.

As shown in FIG. 3, the resin pattern 61 is disposed on the other principal surface 43 of the base 4 in the form of a rectangle in plan view (in an oblong shape in this embodiment). The other principal surface 43 of the base 4 has a resin pattern formed area 47 on which the resin pattern 61 is formed. The resin pattern formed area 47 has an approximately rectangular shape defined by longer sides 471 along the longer side direction of the other principal surface 43 and shorter sides 472 along the shorter side direction of the other principal surface 43. The resin pattern 61 is disposed on the resin pattern formed area 47 while encompassing the other end opening faces 493 of the through holes 49. The resin pattern 61 formed on the resin pattern formed area 47 seals the other end opening faces 493 of the through holes 49, and covers the wiring pattern 55 disposed on periphery portions 551 of the other end opening faces 493 of the through holes 49. Thus, the resin pattern 61 seals the other end opening faces 493 of the through holes 49, which are filled with the infill layers 98. This improves the sealing strength of the through holes 49.

As shown in FIG. 4, parts of the resin pattern 61 contact the infill layers 98 inside the through holes 49. Specifically, the deposition plating at the time of the electrolytic plating of the infill layers 98 raises the other end portion (an end portion at the other end face 982 side of the infill layer 98) of each infill layer 98 at the side of the other principal surface 43 of the base 4, thus turning the other end portion into a convex shape. As shown in FIG. 4, this creates gaps 99 between: the seed film (see reference numeral 92 in FIG. 4) formed at end portions of the internal surfaces 491 of the through holes 49 at the side of the other principal surface 43; and the other end portions of the infill layers 98. The resin material constituting the resin pattern 61 enters the gaps 99 to provide an anchor effect. The anchor effect ensures the adherence among the resin pattern 61, the infill layers 98, and the internal surfaces 491 (the first seed film 92) of the through holes 49. This configuration, in which the resin material of the resin pattern 61 enters the through holes 49, provides an anchor effect to improve the adhesion strength of the resin pattern 61 with respect to the through holes 49.

Parts of the wiring pattern 55 at the side of the other principal surface 43 of the base 4 are formed in a ring shape along both end portions 473 and 474 of the longer sides 471 and the shorter sides 472 of the resin pattern formed area 47. The wiring pattern 55 is not disposed inside the ring shapes. The ring-shape parts of the wiring pattern 55 avoid being sealed by the resin pattern 61. Specifically, the ring-shape parts are disposed at areas 552 that are peripheries of the resin pattern formed area 47 in plan view, along both end portions 473 and 474 of the longer sides 471 and the shorter sides 472 of the resin pattern formed area 47.

On the other principal surface 43 of the base 4, the external terminal electrodes 53 and 54 are disposed on the wiring pattern 55 on the area 552 (peripheral area), which is a periphery of the resin pattern formed area 47 in plan view, and on the resin pattern 61. Specifically, the wiring pattern 55 and the external terminal electrodes 53 and 54 are layered directly on top of one another at the peripheral area 552. At another area (at the resin pattern formed area 47), the wiring pattern 55 and the external terminal electrodes 53 and 54 are disposed as if to sandwich the end portions of the resin pattern 61 (that is, the end portions of the resin pattern 61 are disposed between the layered wiring pattern 55 and external terminal electrodes 53 and 54). Disposing the wiring pattern 55, the external terminal electrodes 53 and 54, and the resin pattern 61 in this manner improves the adhesion strength of the resin pattern 61 with respect to the base 4 and improves the strength of the resin pattern 61.

As described above, the external terminal electrodes 53 and 54, the wiring pattern 55, and the resin pattern 61 are disposed on the other principal surface 43 of the base material constituting the base 4. The resin pattern 61 is layered over the base material of the other principal surface 43 and the wiring pattern 55. The external terminal electrodes 53 and 54 are layered over the wiring pattern 55 and the resin pattern 61. The external terminal electrodes 53 and 54, the wiring pattern 55, and the resin pattern 61 are disposed on the other principal surface 43 such that the external terminal electrodes 53 and 54 are layered over the wiring pattern 55 at peripheral areas along and lateral to the peripheral edge of parts of the layered portion of the resin pattern 61 where the external terminal electrodes 53 and 54 are layered. More specifically, in this embodiment, the external terminal electrode 53 is layered over the wiring pattern 55 at a peripheral area along and lateral to the peripheral edge (see the shorter side 472 and an end portion 473) of a part of the layered portion of the resin pattern 61 where the external terminal electrode 53 is layered. The external terminal electrode 54 is layered over the wiring pattern 55 at a peripheral area along and lateral to the peripheral edge (see the shorter side 472 and an end portion 474) of a part of the layered portion of the resin pattern 61 where the external terminal electrode 54 is layered. In this embodiment, the external terminal electrodes 53 and 54 are each layered over the wiring pattern 55 at a peripheral area along three sides of the peripheral edge of the layered portion of the resin pattern 61. It is preferred that the external terminal electrodes 53 and 54 are each layered over the wiring pattern 55 at a peripheral area along at least two sides of the peripheral edge of the layered portion.

The resin material constituting the resin pattern 61 uses polybenzoxazole (PBO). The resin material constituting the resin pattern 61 is not limited to polybenzoxazole (PBO). It is also possible to use any other resin material that has satisfactory adherence with respect to the material constituting the base 4 (such as glass material). Examples of the resin material constituting the resin pattern 61 include benzocyclobutene (BCB), epoxy, polyimide, and fluororesin. The resin material constituting the resin pattern 61 in this embodiment, namely, polybenzoxazole (PBO), is a photosensitive resin material that ensures pattern formation by photolithography. As used herein, the term photosensitive resin material broadly encompasses photosensitive resin compositions containing photosensitizing agents and resins, as well as resin materials made of photosensitive resins.

Figure 5:
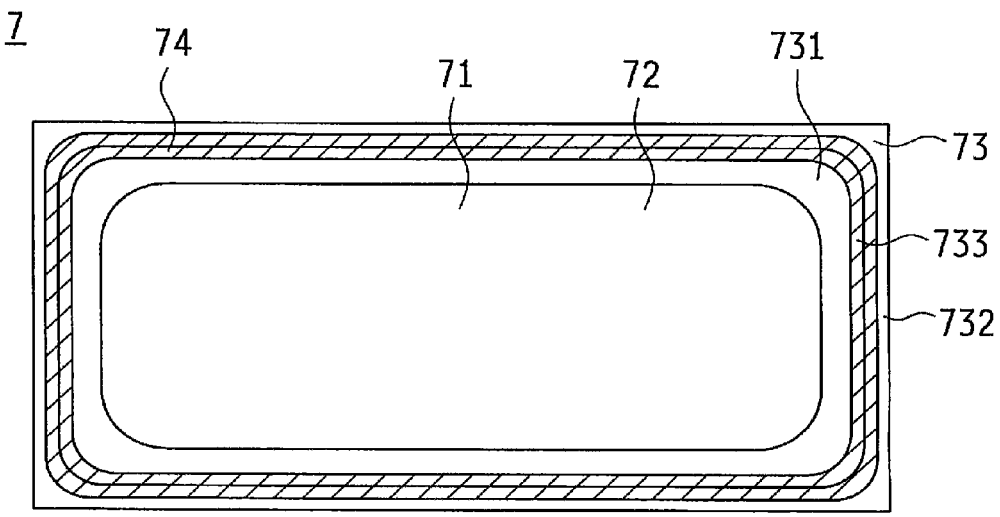
FIG. 5 is a schematic rear view of a lid according to the embodiment of the present invention.

The lid 7 is made of a glass material such as borosilicate glass. As shown in FIGS. 1 and 5, the lid 7 includes a top portion 71 and a wall portion 73 that extends from the top portion 71 downwardly along the outer periphery of one principal surface 72 of the lid 7. To form such lid 7, a base material of a rectangular parallelepiped single plate is wet etched.

Both side faces of the wall portion 73 of the lid 7 (an internal surface 731 and an outer surface 732) each have a tapered shape. The wall portion 73 has a second bonding layer 74 to be bonded with the base 4.

As shown in FIG. 1, the second bonding layer 74 of the lid 7 extends over a top face 733 and the outer surface 732 of the wall portion 73 of the lid 7. The second bonding layer 74 has a multiple-layer structure of a Ti film (not shown) made of Ti and a Au film (not shown) on the Ti film. The Ti film and the Au film are formed by sputtering.

The bonding material 12 bonds the base 4 and the lid 7, and is layered on the second bonding layer 74 of the lid 7. The bonding material 12 has a multiple-layer structure of a Au/Sn film (not shown) made of a Au/Sn alloy plated on the second bonding layer 74 of the lid 7; and a Au film (not shown) plated on the Au/Sn film. The Au film has a multiple-layer structure of a Au strike plated film and a Au plated film plated on the Au strike plated film. In the bonding material 12, the Au/Sn film is melted by heat melting into a Au/Sn alloy film. The bonding material 12 may be a Au/Sn alloy film plated on the second bonding layer 74 of the lid 7. While in this embodiment the bonding material 12 is layered on the second bonding layer 74 of the lid 7, it is also possible to layer the bonding material 12 on the first bonding layer 48 of the base 4.

The crystal resonator plate 2 is a Z-plate quartz crystal into which a crystal blank (not shown) that is an anisotropic crystal plate is formed by wet etching.

As shown in FIG. 6, the crystal resonator plate 2 includes two leg portions 21 and 22 as oscillating portions, a base portion 23, and a bonding portion 24 to be bonded with the electrode pads 51 and 52 of the base 4. The two leg portions 21 and 22 project from the one end face 231 of the base portion 23. The crystal resonator plate 2 also includes a piezoelectric resonator blank 20 formed by projection of the bonding portion 24 from the other end face 232 of the base portion 23.

As shown in FIG. 6, the base portion 23 is bilaterally symmetrical in plan view. The base portion 23 has a side face 233 having one end face 231 side portion and the other end face 232 side portion. The one end face 231 side portion has the same width as the width of the one end face 231, while the other end face 232 side portion gradually diminishes in width from the one end face 231 side toward the other end face 232 side.

As shown in FIG. 6, the two leg portions 21 and 22 project in the same direction from the one end face 231 of the base portion 23. Distal end portions 211 and 221 respectively of the two leg portions 21 and 22 have large widths than the widths of the other portions of the leg portions 21 and 22 (the wideness in width being in the direction perpendicular to the projecting direction). Each of the distal end portions 211 and 221 has round distal corners. Both principal surfaces of each of the two leg portions 21 and 22 have groove portions 25 for the betterment of the CI value.

As shown in FIG. 6, the bonding portion 24 projects from a center portion of the other end face 232 of the base portion 23 in the width direction. The bonding portion 24 includes a shorter side portion 241 and a longer side portion 242. The shorter side portion 241 projects perpendicular to the other end face 232 of the base portion 23 in plan view. The longer side portion 242 is coupled to an end portion of the shorter side portion 241 extends in the width direction of the base portion 23. The longer side portion 242 has a distal end portion 243 oriented in the width direction of the base portion 23. That is, the bonding portion 24 has an L shape in plan view, which is folded at a right angle in plan view. The bonding portion 24 also has two bonding points 27 to be coupled to the electrode pads 51 and 52 of the base 4 via the conductive bump 13.

The crystal resonator plate 2 thus configured includes first and second excitation electrodes 31 and 32 that have different potentials, and extraction electrodes 33 and 34 respectively extended from the first and second excitation electrodes 31 and 32 to electrically couple the first and second excitation electrodes 31 and 32 to the electrode pads 51 and 52 of the base 4.

Parts of the first and second excitation electrodes 31 and 32 are disposed inside the groove portions 25 of the leg portions 21 and 22. This minimizes vibration loss of the leg portions 21 and 22 even if the crystal resonator plate 2 is downsized, thus minimizing the CI value.

First excitation electrodes 31 are disposed at both principal surfaces of the one leg portion 21, at both side faces of the other leg portion 22, and at both principal surfaces of the distal end portion 221. Similarly, second excitation electrodes 32 are disposed at both principal surfaces of the other leg portion 22, at both side faces of the one leg portion 21, and at both principal surfaces of the distal end portion 211.

The extraction electrodes 33 and 34 are disposed on the base portion 23 and the bonding portion 24. The extraction electrode 33 on the base portion 23 couples the first excitation electrodes 31 on both principal surfaces of the one leg portion 21 to both side faces of the other leg portion 22 and to the first excitation electrodes 31 on both principal surfaces of the distal end portion 221. The extraction electrode 34 on the base portion 23 couples the second excitation electrodes 32 on both principal surfaces of the other leg portion 22 to both side faces of the one leg portion 21 and to the second excitation electrodes 32 on both principal surfaces of the distal end portion 211.

The base portion 23 has two through holes 26 passing through both principal surfaces of the piezoelectric resonator blank 20. The through holes 26 are filled with a conducting material. The extraction electrodes 33 and 34 are extended between both principal surfaces of the base portion 23 via the through holes 26.

As shown in FIG. 1, in the crystal resonator 1 thus configured, the bonding portion 24 of the crystal resonator plate 2 is electrically and mechanically bonded by ultrasonic bonding of FCB to the pedestal portion 46 on the one principal surface 42 of the base 4 via the conductive bump 13. The bonding electrically and mechanically bonds the excitation electrodes 31 and 32 of the crystal resonator plate 2 to the electrode pads 51 and 52 of the base 4 via the extraction electrodes 33 and 34 and the conductive bump 13. Thus, the crystal resonator plate 2 is mounted on the base 4. Then, the lid 7 is temporarily bonded by FCB to the base 4 on which the crystal resonator plate 2 is mounted. Then, the resulting product is heated in a vacuum atmosphere to melt the bonding material 12, the first bonding layer 48, and the second bonding layer 74. This causes the first bonding layer 48 of the base 4 to be bonded to the second bonding layer 74 of the lid 7 via the bonding material 12, thus producing the crystal resonator 1 that hermetically encloses the crystal resonator plate 2. The conductive bump 13 used is a bump plating made of a non-liquid member.

Next, a method for producing the crystal resonator 1 and the base 4 will be described below by referring to FIGS. 7 to 30.

Figure 7:
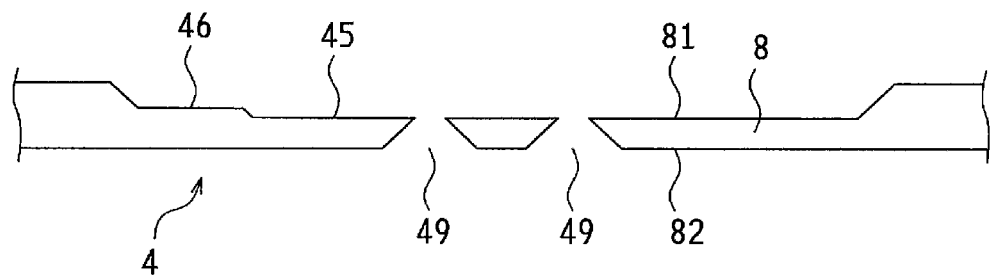
FIG. 7 is a schematic partial cross-sectional view of a wafer in a step of a production process of the base according to the embodiment of the present invention.

This embodiment uses a single plate wafer 8 which is made of a glass material and from which a plurality of bases 4 are formed. First, both principal surfaces 81 and 82 of the wafer 8 are etched by wet etching using photolithography to form a plurality of bases 4 each having a pedestal portion 46, a cavity 45, and through holes 49 as shown in FIG. 7 (base forming step). FIG. 7 shows one of the bases 4 formed by etching of both principal surfaces 81 and 82 of the wafer 8. The base 4 has the cavity 45, the pedestal portion 46, and the through holes 49. The pedestal portion 46, the cavity 45, the through holes 49, and other members of the base 4 may be formed by dry etching or mechanical processing such as a sandblast method.

Figure 8:
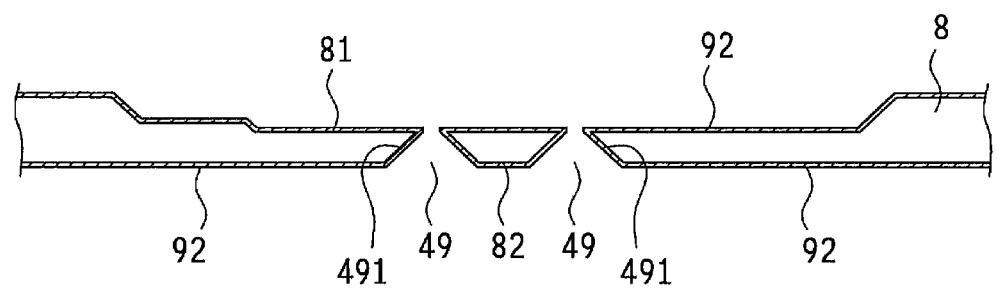
FIG. 8 is a schematic partial cross-sectional view of the wafer in a step of the production process of the base according to the embodiment of the present invention.

After the base forming step, a Ti layer made of Ti is formed on the wafer 8 (including both principal surfaces 81 and 82 and the internal surfaces 491 of the through holes 49) by sputtering. After the Ti layer formation, a Cu layer made of Cu is layered on the Ti layer by sputtering, thus forming a first metal layer 92 as shown in FIG. 8 (metal layer forming step). The formed first metal layer 92 serves as the first seed film 92, which is made of the Ti film and the Cu film, to constitute the electrode pads 51 and 52 and the wiring pattern 55 of the base 4 shown in FIG. 1.

Figure 9:
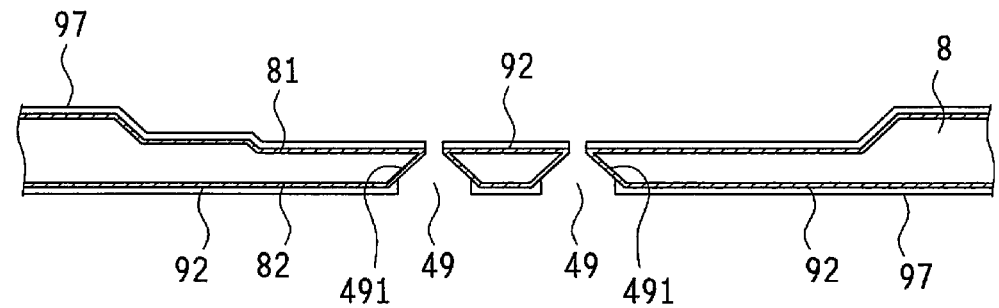
FIG. 9 is a schematic partial cross-sectional view of the wafer in a step of the production process of the base according to the embodiment of the present invention.

After the metal layer forming step, a resist is applied on the first metal layer 92 by dip-coating, thus forming a new positive resist layer 97 (resist layer forming step). Then, exposure and development by photolithography are carried out with respect to parts of the positive resist layer 97 formed on the open end portions of the through holes 49 of the wafer 8 at the side of the one principal surface 81, thus carrying out pattern formation with respect to the internal surfaces of the through holes 49 as shown in FIG. 9 (pattern forming step).

Figure 10:
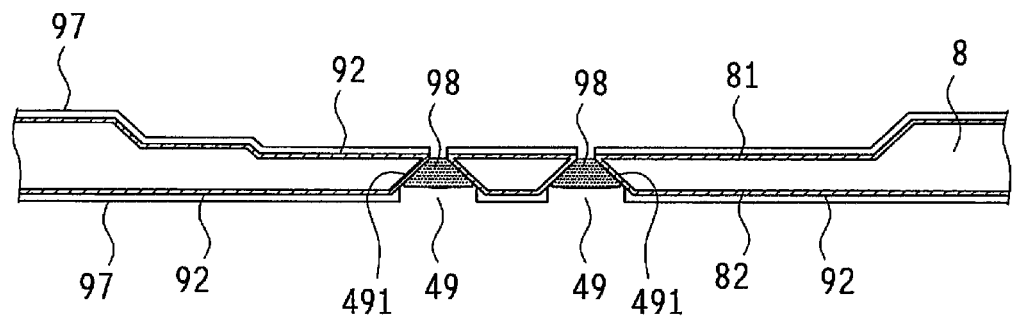
FIG. 10 is a schematic partial cross-sectional view of the wafer in a step of the production process of the base according to the embodiment of the present invention.

After the pattern forming step, Cu electrolytic plating is carried out with respect to the first metal layer 92 (seed film) exposed at the internal surfaces 491 of the through holes 49, thus plating infill layers 98 made of Cu as shown in FIG. 10 (filling step).

Figure 11:
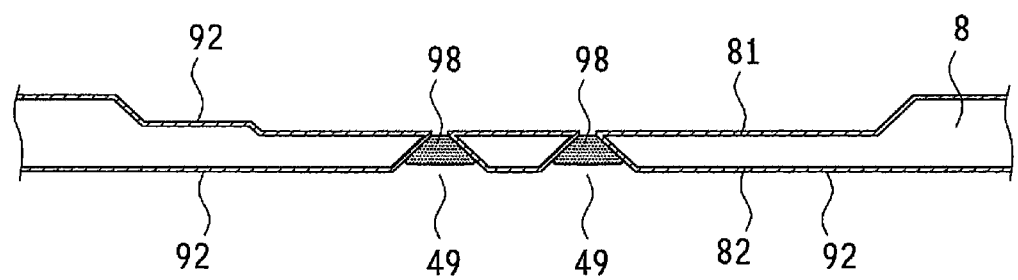
FIG. 11 is a schematic partial cross-sectional view of the wafer in a step of the production process of the base according to the embodiment of the present invention.
Figure 12:
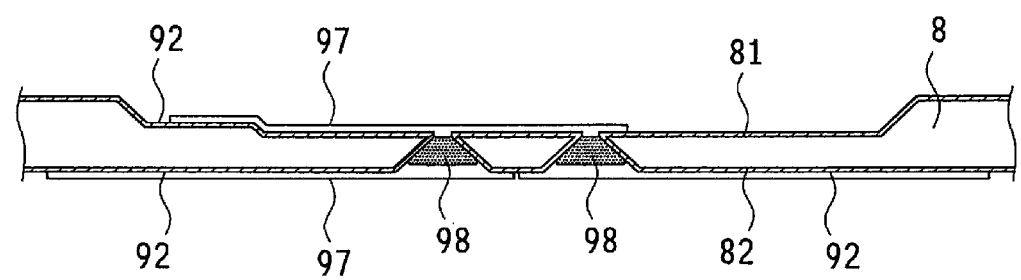
FIG. 12 is a schematic partial cross-sectional view of the wafer in a step of the production process of the base according to the embodiment of the present invention.

After the filling step, the positive resist layer 97 is delaminated as shown in FIG. 11 (resist delamination step).

After the resist delamination step, a resist is applied on the first metal layer 92 and the infill layer 98 by dip-coating, thus forming a new positive resist layer 97 (second resist layer forming step). Then, exposure and development are carried out with respect to the positive resist layer except for parts of the positive resist layer corresponding to the to-be-formed electrode pads 51 and 52 and the wiring pattern 55, thus carrying out pattern formation of the electrode pads 51 and 52, the wiring pattern 55, and the outline of the base 4 shown in FIG. 1 (second pattern forming step shown in FIG. 12).

Figure 13:
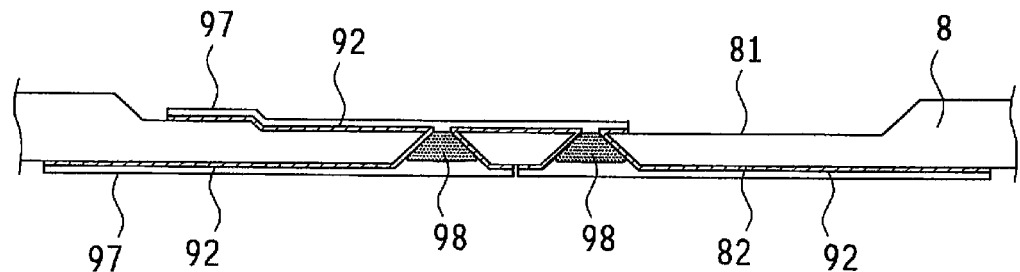
FIG. 13 is a schematic partial cross-sectional view of the wafer in a step of the production process of the base according to the embodiment of the present invention.

After the second pattern forming step, the exposed first metal layer 92 is removed by metal etching (metal etching step shown in FIG. 13).

Figure 14:
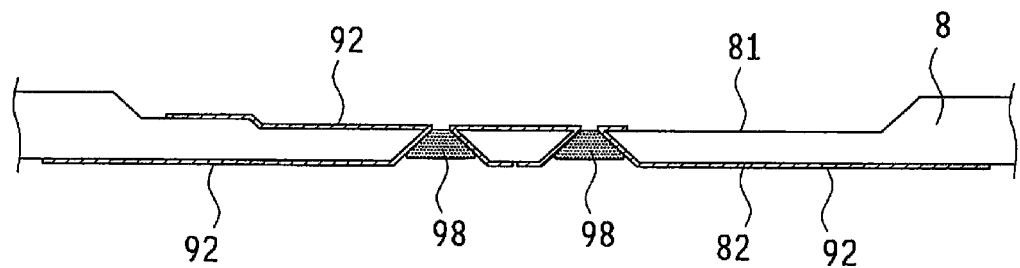
FIG. 14 is a schematic partial cross-sectional view of the wafer in a step of the production process of the base according to the embodiment of the present invention.
Figure 15:
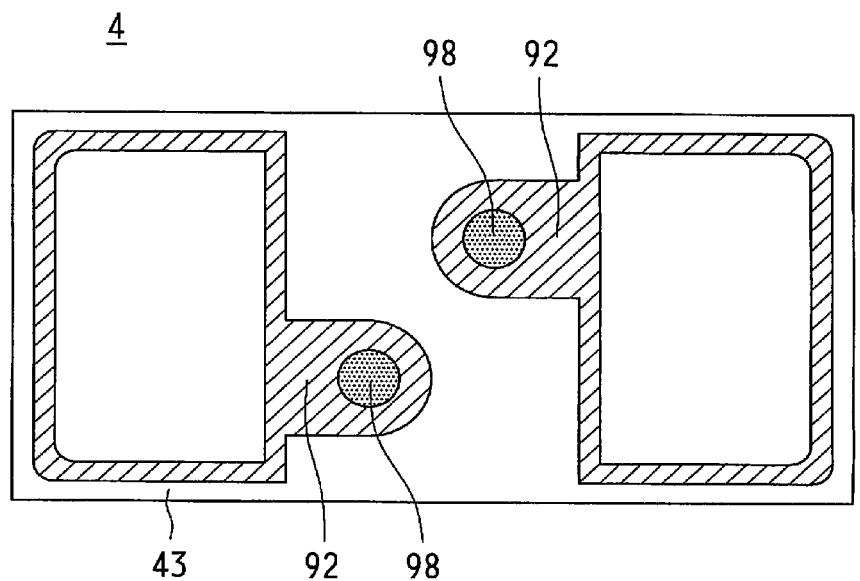

After the metal etching step, the positive resist layer 97 is delaminated as shown in FIG. 14 (second resist delamination step). FIG. 15 shows a plan view of the other principal surface 43 of the base 4 (a rear view of the base 4) after the second resist delamination step shown in FIG. 14.

Figure 16:
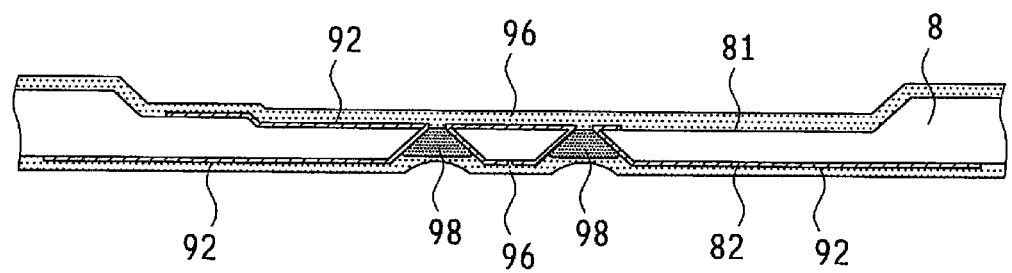
FIG. 16 is a schematic partial cross-sectional view of the wafer in a step of the production process of the base according to the embodiment of the present invention.

After the second resist delamination step, a photosensitive resin material is applied on the first metal layer 92, the infill layer 98, and both principal surfaces 81 and 82 of the exposed wafer 8 by dip-coating, thus forming a resin layer 96 as shown in FIG. 16 (resin layer forming step).

Figure 17:
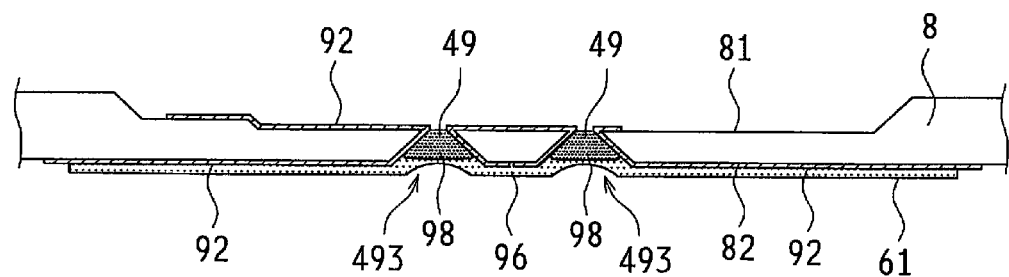
FIG. 17 is a schematic partial cross-sectional view of the wafer in a step of the production process of the base according to the embodiment of the present invention.
Figure 18:
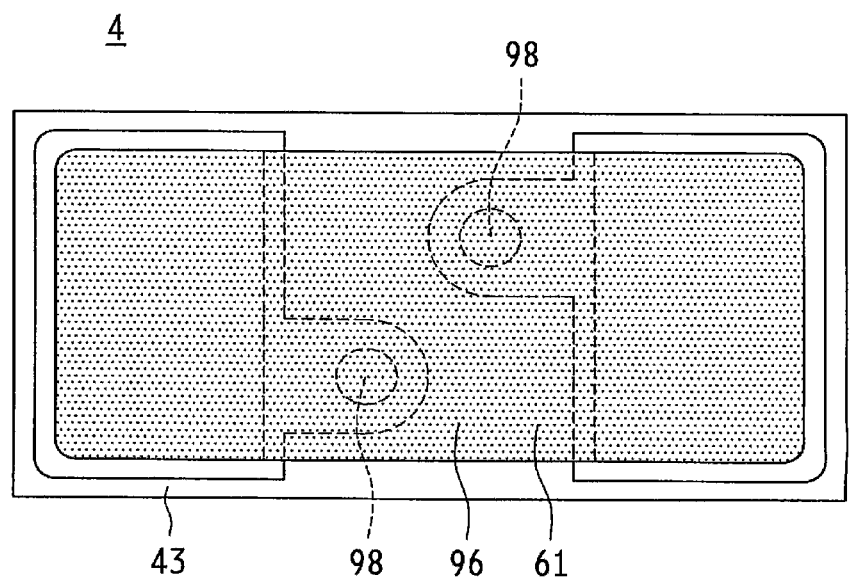
FIG. 18 is a schematic rear view of the base shown in FIG. 17.

After the resin layer forming step, exposure and development by photolithography are carried out with respect to the resin layer 96 except for parts of the resin layer 96 corresponding to the to-be-formed resin pattern 61 that seals the open end portions of the through holes 49 at the side of the other end opening face 493, thus forming the resin pattern 61 as shown in FIG. 17 (resin pattern forming step). FIG. 18 shows a plan view of the other principal surface 43 of the base 4 (a rear view of the base 4) after the resin pattern forming step shown in FIG. 17. In a subsequent production step after the resin pattern forming step shown in FIGS. 17 and 18, an electrode (the second metal layer 93) is formed on the resin pattern 61. In order to improve the adherence of the resin pattern 61 with respect to the second metal layer 93, the resin pattern 61 may be activated by grinding the surface of the resin pattern 61 by plasma ashing using inert gas (e.g., Ar gas). Roughening the surface of the resin pattern 61 causes the second metal layer 93 (specifically, the Ti layer) to enter the rough portions of the roughened surface of the resin pattern 61, thereby providing an anchor effect that improves the bondability between the resin pattern 61 and the second metal layer 93. That is, on the other principal surface 43 of the base 4, the bondability improves between the resin pattern 61 and the external terminal electrodes 53 and 54. The amount of grinding on the surface of the resin pattern 61 in the plasma ashing is equal to or more than 0.2 μm, for example.

Figure 19:
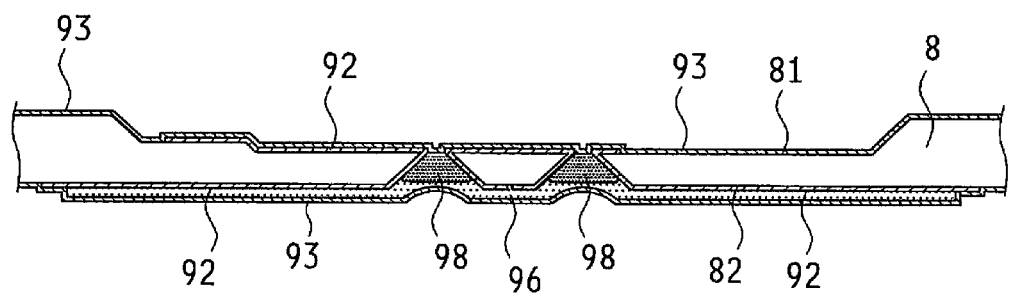
FIG. 19 is a schematic partial cross-sectional view of the wafer in a step of the production process of the base according to the embodiment of the present invention.

After the resin pattern forming step, a Ti layer made of Ti is formed by sputtering on the exposed first metal layer 92 and resin layer 96 and the exposed both principal surfaces 81 and 82 of the wafer 8. After the Ti layer formation, a Au layer is layered on the Ti layer by sputtering, thus forming a second metal layer 93 as shown in FIG. 19 (second metal layer forming step). The formed second metal layer 93 serves as the sputtering film made of the Ti film and the Au film to constitute the first bonding layer 48, and as the second seed film 92 made of the Ti film and the Au film to constitute the electrode pads 51 and 52, the external terminal electrodes 53 and 54, and the wiring pattern 55 shown in FIG. 1.

Figure 20:
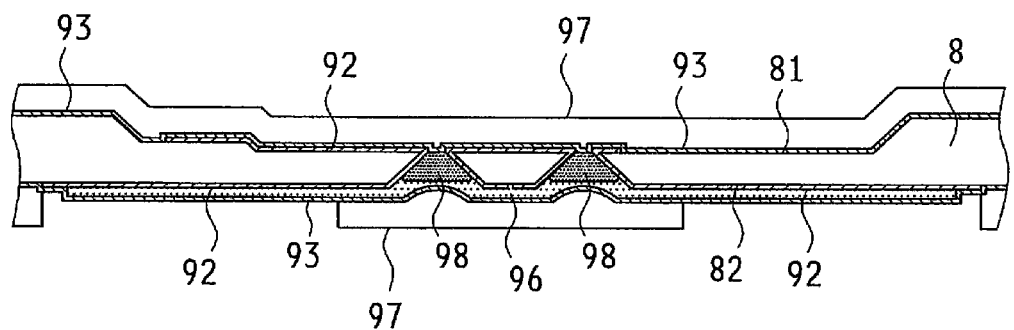
FIG. 20 is a schematic partial cross-sectional view of the wafer in a step of the production process of the base according to the embodiment of the present invention.

After the second metal layer forming step, a resist is applied on the second metal layer 93 by dip-coating, thus forming a new positive resist layer 97 (third resist layer forming step). Then, as shown in FIG. 20, exposure and development by photolithography are carried out with respect to parts of the positive resist layer 97 corresponding to the to-be-formed external terminal electrodes 53 and 54 of the base 4, thus carrying out pattern formation of the external terminal electrodes 53 and 54 of the base 4 shown in FIG. 1 (third pattern forming step).

Figure 21:
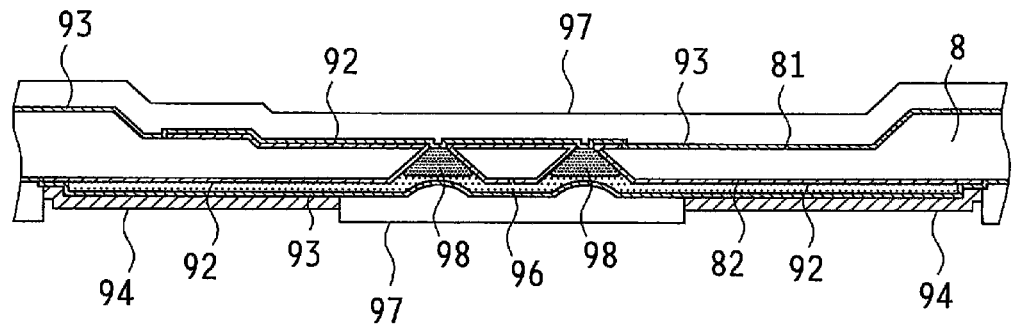
FIG. 21 is a schematic partial cross-sectional view of the wafer in a step of the production process of the base according to the embodiment of the present invention.

After the third pattern forming step, a first plated layer 94 made of Ni is plated on the exposed second metal layer 93 as shown in FIG. 21 (first plate forming process). The formed first plated layer 94 serves as the first plated film of Ni on the external terminal electrodes 53 and 54 of the base 4 (see reference numeral 94 in FIG. 1).

Figure 22:
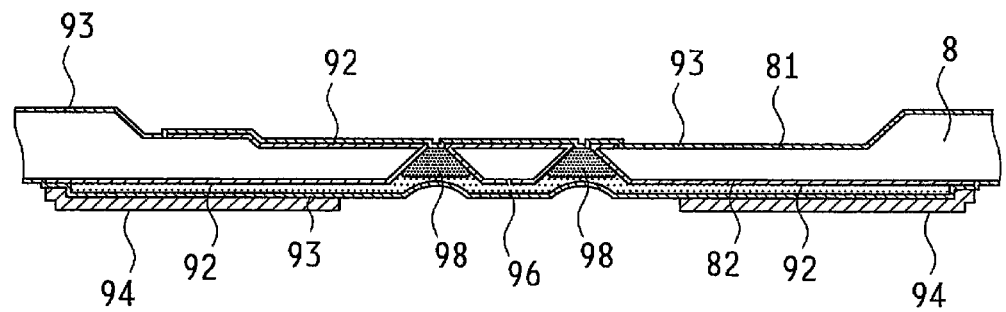
FIG. 22 is a schematic partial cross-sectional view of the wafer in a step of the production process of the base according to the embodiment of the present invention.

After the first plate forming process, the positive resist layer 97 is delaminated as shown FIG. 22 (third resist delamination step).

Figure 23:
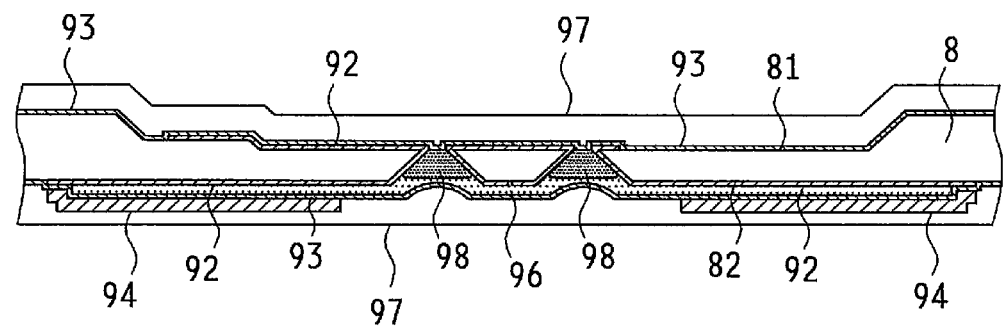
FIG. 23 is a schematic partial cross-sectional view of the wafer in a step of the production process of the base according to the embodiment of the present invention.
Figure 24:
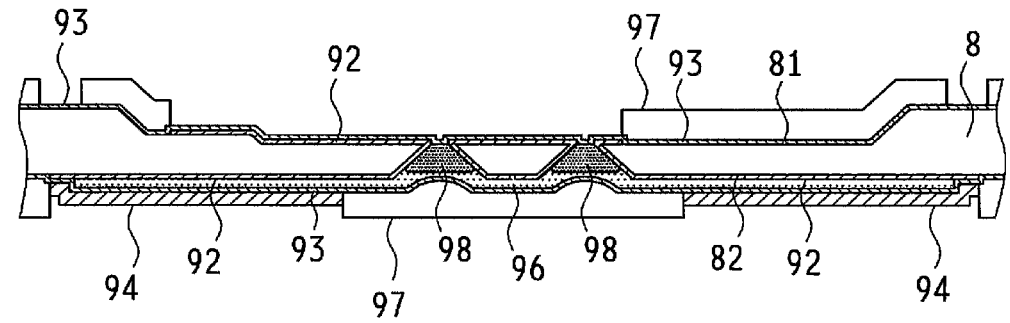
FIG. 24 is a schematic partial cross-sectional view of the wafer in a step of the production process of the base according to the embodiment of the present invention.

After the third resist delamination step, a resist is applied on the exposed second metal layer 93 and first plated layer 94 by dip-coating, thus forming a new positive resist layer 97 as shown in FIG. 23 (fourth resist layer forming step). Then, exposure and development by photolithography are carried out with respect to parts of the positive resist layer 97 corresponding to the to-be-formed first bonding layer 48, electrode pads 51 and 52, external terminal electrodes 53 and 54, and wiring pattern 55 of the base 4. Thus, as shown in FIG. 24, pattern formation is carried out with respect to the first bonding layer 48, the electrode pads 51 and 52, the external terminal electrodes 53 and 54, and the wiring pattern 55 of the base 4 shown in FIG. 1 (fourth pattern forming step).

Figure 25:
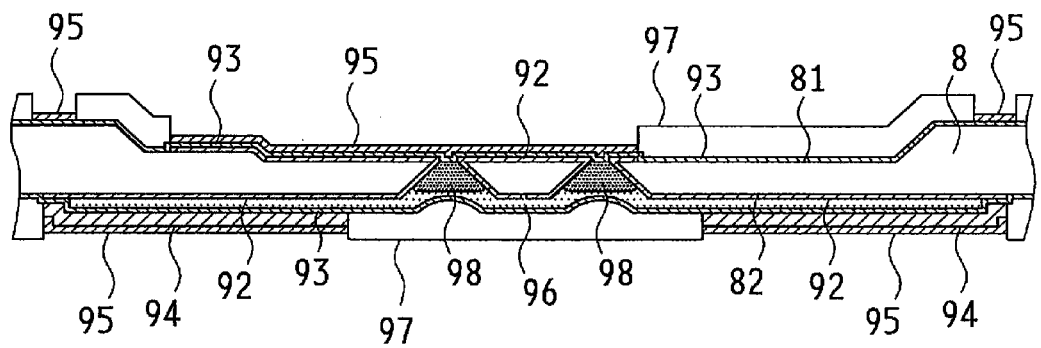
FIG. 25 is a schematic partial cross-sectional view of the wafer in a step of the production process of the base according to the embodiment of the present invention.

After the fourth pattern forming step, a second plated layer 95 made of Au is plated on the exposed second metal layer 93 and first plated layer 94 as shown in FIG. 25 (second plate forming step). The formed second plated layer 95 serves as the second plated film (see reference numeral 95 in FIG. 1) made of the Au film to constitute the first bonding layer 48, the electrode pads 51 and 52, the external terminal electrodes 53 and 54, and the wiring pattern 55 of the base 4 shown in FIG. 1.

Figure 26:
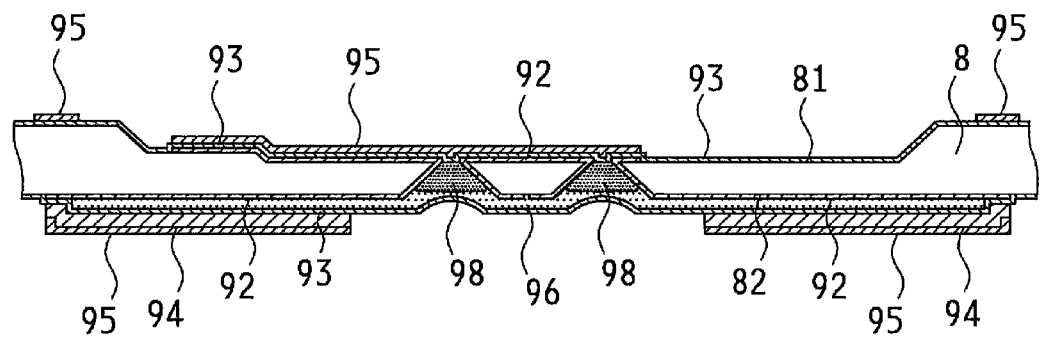
FIG. 26 is a schematic partial cross-sectional view of the wafer in a step of the production process of the base according to the embodiment of the present invention.

After the second plate forming step, the positive resist layer 97 is delaminated as shown in FIG. 26 (fourth resist delamination step).

Figure 27:
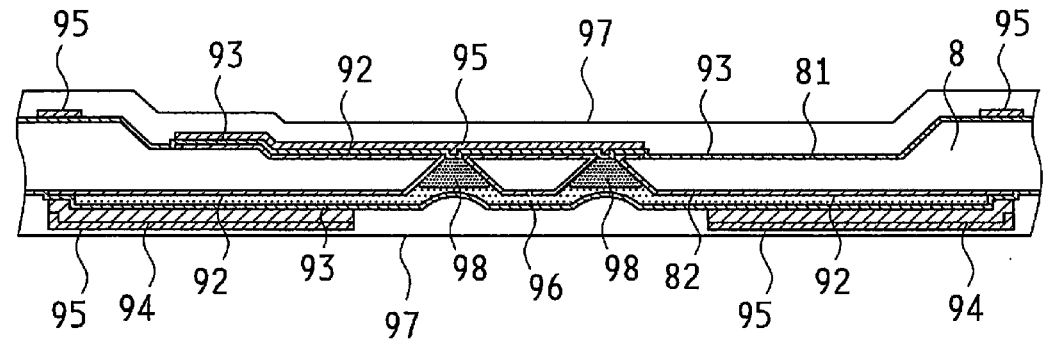
FIG. 27 is a schematic partial cross-sectional view of the wafer in a step of the production process of the base according to the embodiment of the present invention.
Figure 28:
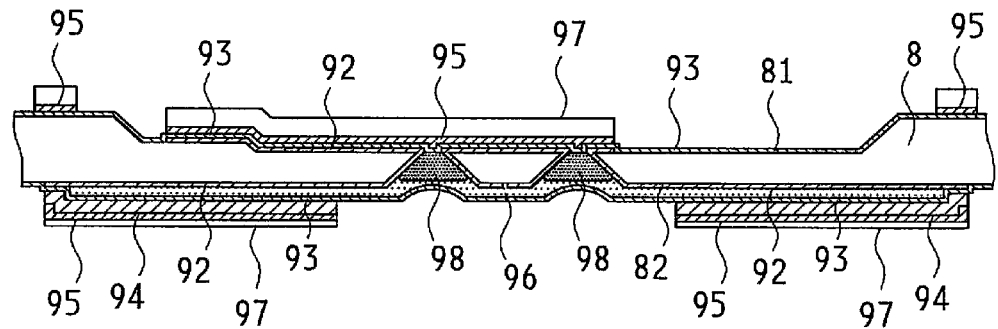
FIG. 28 is a schematic partial cross-sectional view of the wafer in a step of the production process of the base according to the embodiment of the present invention.

After the fourth resist delamination step, a resist is applied on the exposed second metal layer 93 and second plated layer 95 by dip-coating, thus forming a new positive resist layer 97 as shown in FIG. 27 (fifth resist layer forming step). Then, exposure and development by photolithography are carried out with respect to parts of the positive resist layer 97 corresponding to the to-be-formed first bonding layer 48, electrode pads 51 and 52, external terminal electrodes 53 and 54, and wiring pattern 55 of the base 4 shown in FIG. 1. Thus, as shown in FIG. 28, pattern formation is carried out for the outlines of the first bonding layer 48, the electrode pads 51 and 52, the external terminal electrodes 53 and 54, the wiring pattern 55 of the base 4, and the base 4 shown in FIG. 1 (fifth pattern forming step).

Figure 29:
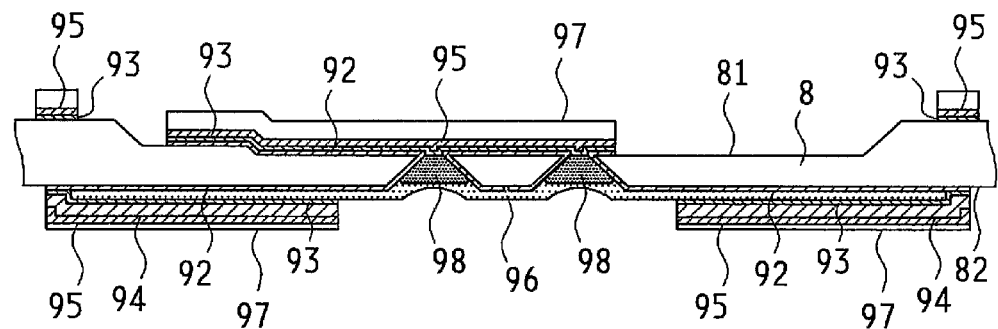
FIG. 29 is a schematic partial cross-sectional view of the wafer in a step of the production process of the base according to the embodiment of the present invention.

After the fifth pattern forming step, the exposed second metal layer 93 is delaminated by metal etching as shown in FIG. 29 (second metal etching step).

Figure 30:
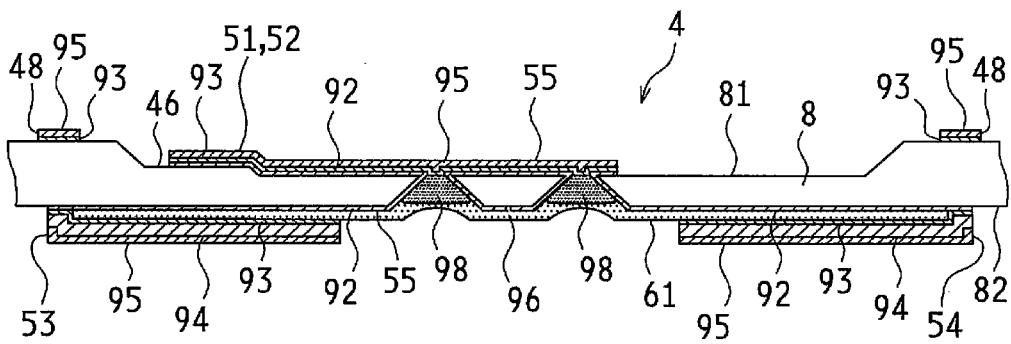
FIG. 30 is a schematic partial cross-sectional view of the wafer in a step of the production process of the base according to the embodiment of the present invention.

After the second metal etching step, the positive resist layer 97 is delaminated, thus forming a plurality of bases 4 on the wafer 8 as shown in FIG. 30 (fifth resist delamination step). FIG. 3 shows a plan view of the other principal surface 43 of the base 4 (a rear view of the base 4) after the fifth resist delamination step shown in FIG. 30.

After the fifth resist delamination step, the plurality of bases 4 are divided into individual bases 4 (base dividing step), thus producing the plurality of bases 4 shown in FIGS. 2 and 3.

Then, based on the position of the cut-out portion 541, the crystal resonator plate 2 shown in FIG. 6 is disposed on the base 4 shown in FIGS. 2 and 3. The crystal resonator plate 2 is electrically and mechanically bonded to the base 4 via the conductive bump 13 by ultrasonic bonding of FCB, thus mounting the crystal resonator plate 2 on the base 4. In another step, the bonding material 12 is layered on the second bonding layer 74 of the lid 7 shown in FIG. 5. Then the lid 7 is disposed on the base 4 on which the crystal resonator plate 2 is mounted. The first bonding layer 48 of the base 4 and the second bonding layer 74 of the lid 7 are electrically and mechanically bonded to one another via the bonding material 12 by ultrasonic bonding of FCB. Thus, the crystal resonator 1 shown in FIG. 1 is produced.

In the above-described production process, the step of forming the through holes 49 in the base forming step corresponds to the through hole forming step of the present invention. The step of forming the first metal layer 92, which is a seed film, on the internal surfaces 491 of the through holes 49 after the metal layer forming step corresponds to the seed film forming step of the present invention. In the filling step, the step of Cu electrolytic plating on the exposed first metal layer 92 (first seed film 92) at the internal surfaces 491 of the through holes 49 corresponds to the plating step of the present invention. The step of forming the resin pattern 61 and sealing the open end portion 493 at the other end opening face 493 side of the through holes 49 with the resin pattern 61, after the resin layer forming step and the resin pattern forming step, corresponds to the hole sealing step of the present invention.

The above-described production process is merely one of many that embody the present invention and should not be construed in a limiting sense. Other embodiments are also possible in producing the crystal resonator 1.

As described above, the crystal resonator 1 and the electronic component package according to this embodiment minimize the degradation of air tightness in the internal space 11 even when a resin material (resin pattern 61) is adopted on the other principal surface 43 of the base 4.

Specifically, the resin pattern 61 is layered over the base 4 at the other principal surface 43 and the wiring pattern 55, and the external terminal electrodes 53 and 54 are layered over the wiring pattern 55 and the resin pattern 61. Even if the adhesion strength of the resin pattern 61 with respect to the wiring pattern 55 is poor, the adhesion of the resin pattern 61 to the base 4 and the adhesion of the external terminal electrodes 53 and 54 to the wiring pattern 55 provide a complement to the adhesion of the resin pattern 61 to the base 4.

The external terminal electrodes 53 and 54 are layered over the wiring pattern 55 at peripheral areas (see reference numeral 552 shown in FIG. 4) along and lateral to the peripheral edge of parts of the layered portion of the resin pattern 61 where the external terminal electrodes 53 and 54 are layered. This is preferred for the bonding of the resin pattern 61 to the base material of the base 4 in that the layering of the external terminal electrodes 53 and 54 over the wiring pattern 55 is in a manner to surround the parts of the layered portion of the resin pattern 61 where the external terminal electrodes 53 and 54 are layered.

The resin material 61 seals the other end opening faces 493 of the through holes 49 passing through both principal surfaces 42 and 43 of the base 4. This minimizes detachment of the conducting materials (see the infill layers 98) filling the through holes 49 and minimizes dropping of the conducting materials out of the through holes 49. Additionally, the resin material 61 sealing the other end opening faces 493 of the through holes 49 blocks heat conduction from the other principal surface 43 of the base 4 to the infill layers 98 filling the through holes 49. This minimizes degradation of the adherence between the infill layers 98 and the base material constituting the base 4, in spite of, for example, heat associated with mounting of the crystal resonator 1 on the board. This in turn minimizes degradation of air tightness in the internal space 11.

In the crystal resonator 1 according to this embodiment, the infill layer 98 includes a Cu plated layer plated on the seed film (see reference numeral 92 in FIG. 1) on the internal surface of each through hole 49. This, however, should not be construed as limiting the infill layer 98; any other configuration is possible insofar as the through hole 49 is filled with a conducting material. For example, the infill layer 98 may be a metal paste (a resin material paste with a conductive filler added thereto) filling the through hole 49.

Figure 31:
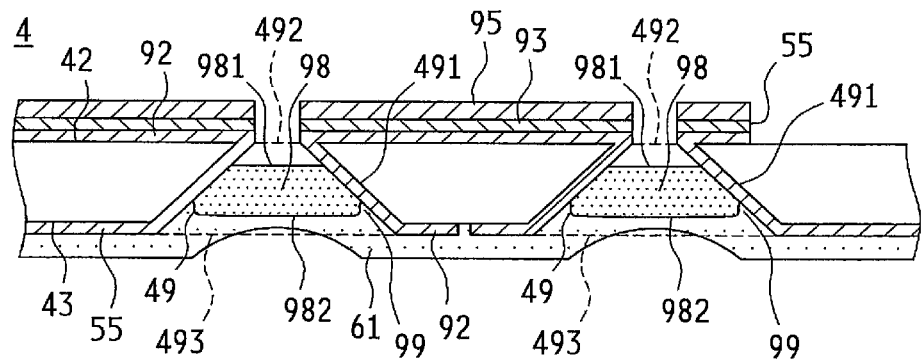
FIG. 31 is a schematic cross-sectional view of a base according to another embodiment, for schematically illustrating a part of the through hole corresponding to FIG. 4.
Figure 32:
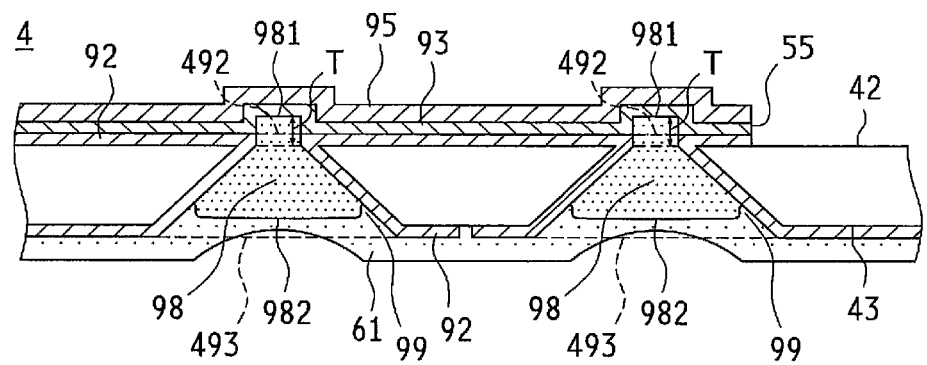
FIG. 32 is a schematic cross-sectional view of a base according to another embodiment, for schematically illustrating a part of the through hole corresponding to FIG. 4.

In the crystal resonator 1 according to this embodiment, as shown in FIG. 4, the one end face 981 of the infill layer 98 at the side of the one principal surface 42 of the base 4 is flush with the one principal surface 42 of the base 4. This, however, is a preferred example and should not be construed in a limiting sense. Any other configuration of the infill layer 98 is possible insofar as the through holes 49 are sealed. As shown in FIG. 31, the one end face 981 of the infill layer 98 may be disposed below the one principal surface 42 of the base 4. Alternatively, as shown in FIG. 32, the one end face 981 of the infill layer 98 may be disposed above the one principal surface 42 of the base 4. That is, in the configuration shown in FIG. 32, a projecting portion (a portion projecting from the one principal surface 42 of the base 4) of the infill layer 98 preferably has a thickness T of equal to or less than 2 µm so as to avoid contact of the crystal resonator plate 2 with the plated film (see the second plated film 95 in FIG. 4) constituting the wiring pattern 55 on the infill layer 98.

Figure 33:
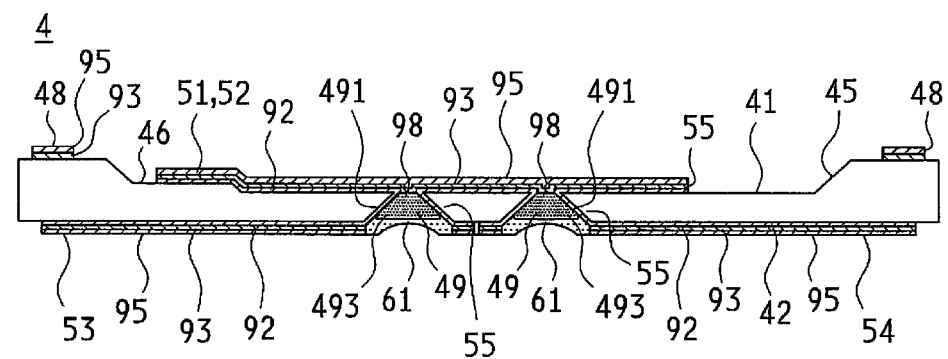
FIG. 33 is a schematic cross-sectional view of a base according to another embodiment.

In the crystal resonator 1 according to this embodiment, the resin pattern 61, which seals the other end opening faces 493 of the through holes 49, is formed approximately over the entire surface of the other principal surface 43, except its outer periphery portion. This, however, is a preferred example and should not be construed in a limiting sense. For example, as shown in FIG. 33, a resin pattern may be formed only on the other end opening faces 493 of the through holes 49. This ensures a prevention effect of dropping of the conducting material (constituent material of the infill layer 98) filling each through hole 49. In the configuration shown in FIG. 33, the external terminal electrodes 53 and 54 include a second seed film 93 (see the second seed film 93 in FIG. 1) and a second plated film 95 (see FIG. 33). The second seed film 93 is made of a Ti film and a Au film and disposed on the wiring pattern 55 (see the first seed film 92 in FIG. 1) on the other principal surface 43 of the base 4. The second plated film 95 is made of a Au film and disposed on the second seed film 93.

In the crystal resonator 1 according to this embodiment, the electrode pads 51 and 52 and the wiring pattern 55 include the first seed film 92, the second seed film 93, and the second plated film 95. The first seed film 92 is made of a Ti film and a Cu film and disposed on the base material of the base 4. The second seed film 93 is made of a Ti film and a Au film and disposed on the first seed film 92. The second plated film 95 is made of a Au film plated on the second seed film 93. This, however, should not be construed as limiting the electrode configuration of the electrode pads 51 and 52 and the wiring pattern 55. The electrode pads 51 and 52 and the wiring pattern 55 may be without the intermediation of the seed film made of the Ti film and the Cu film; the seed film made of the Ti film and the Au film may be formed directly on the base material of the base 4, and the Au film may be plated on this seed film. That is, the seed film of the wiring pattern 55 on the internal surfaces 491 of the through holes 49 may be made of the Ti film and the Au film. In the case where the seed film on the internal surfaces 491 of the through holes 49 is made of the Ti film and the Au film in the above manner, the infill layers 98 plated on the seed film of the wiring pattern 55 on the internal surfaces 491 of the through holes 49 are preferably Au/Sn plated layers. This improves the adhesion strength between the infill layers 98 and the seed film of the wiring pattern 55 on the internal surfaces 491.

In the base 4 of the crystal resonator 1 according to this embodiment, the first seed film 92 includes a Ti film and a Cu film. This, however, should not be construed in a limiting sense. It is also possible to use a Mo film of Mo instead of the Ti film.

In the base 4 of the crystal resonator 1 according to this embodiment, the first plated layer 94 includes a Ni film. This, however, should not be construed in a limiting sense. A Cu film of Cu may be formed under a Ni film, i.e., a Ni film may be layered over a Cu film.

In the base 4 of the crystal resonator 1 according to this embodiment, the second plated film 95 includes a Au film. This, however, should not be construed in a limiting sense. The second plated film 95 may have a two-layer structure of a Au film and a Pd film of Pd over the Au film.

In the base 4 of the crystal resonator 1 according to the embodiment, the second seed film 93 includes the Ti film and the Au film. This, however, should not be construed in a limiting sense. It is also possible to use a Mo film made of Mo instead of the Ti film. It is further possible to use a Mo film and a Cu film made of Cu instead of the Ti film and the Au film.

In the base 4 of the crystal resonator 1 according to the embodiment, the first bonding layer 48 includes the plated film designated by reference numeral 95 and the sputtering film designated by reference numeral 93. This, however, should not be construed in a limiting sense. Referring to FIG. 1, a first plated film designated by reference numeral 94 may be interposed between the plated film designated by reference numeral 95 and the sputtering film designated by reference numeral 93.

In the base 4 of the crystal resonator 1 according to the embodiment, the electrode pads 51 and 52 include the first seed film designated by reference numeral 92, the second seed film designated by reference numeral 93, and the second plated film designated by reference numeral 95. This, however, should not be construed in a limiting sense. Referring to FIG. 1, a first plated film designated by reference numeral 94 may be interposed between the first seed film and the second seed film.

In the base 4 of the crystal resonator 1 according to this embodiment, the first bonding layer 48 includes: the sputtering film (see reference numeral 93 in FIG. 1) made of a Ti film and a Au film on the base material of the base 4 by sputtering; and the plated film (see reference numeral 95 in FIG. 1) made of a Au film plated on the sputtering film. This, however, should not be construed in a limiting sense. For example, the first bonding layer 48 may include: a sputtering film made of a Ti film and a Au film formed on the base material of the base 4 by sputtering; a Ni plated film plated on the sputtering film; and a Au plated film plated on the Ni plated film. Disposing the Ni plated film between the sputtering film and the Au plated film in the above manner minimizes erosion of the sputtering film (Au film) by the bonding material 12 (brazing filler metal), and improves the adhesion strength between the base 4 and the lid 7.

In the base 4 of the crystal resonator 1 according to this embodiment, the external terminal electrodes 53 and 54 include the second seed film 93, the first plated film 94, and the second plated film 95. The second seed film 93 is made of a Ti film and a Au film and disposed on the first seed film 92 of the wiring pattern 55 of the other principal surface 43 of the base 4 and on the resin pattern 61. The first plated film 94 is made of Ni plated on the second seed film 93. The second plated film 95 is made of Au and plated on the first plated film. This, however, should not be construed in a limiting sense. For example, the second plated film 95 made of Au may be disposed directly (without the intermediation of the first plated film 94 of Ni) on the second seed film 93.

While in this embodiment the material used as the base 4 and the lid 7 is glass, the base 4 and the lid 7 will not be limited to glass. For example, it is also possible to use a crystal.

While in this embodiment Au/Sn is mainly used as the bonding material 12, the bonding material 12 will not be particularly limited insofar as the base 4 and the lid 7 are bonded to one another. For example, it is also possible to use a Sn alloy brazing filler metal of Cu/Sn or the like.

Figure 34:
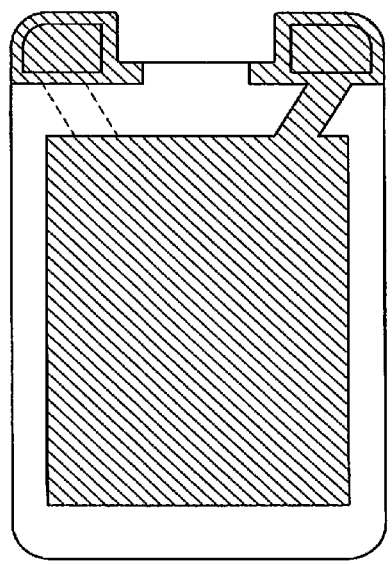
FIG. 34 is a schematic plan view of a crystal resonator plate according to another embodiment.

While in this embodiment the crystal resonator 1 uses the tuning-fork crystal resonator plate 2 shown in FIG. 6 as the crystal resonator plate, it is also possible to use an AT-cut crystal resonator plate 2 as shown in FIG. 34. In the crystal resonator 1 with the AT-cut crystal resonator plate 2, electrodes are formed on the base 4 in conformity with the AT-cut crystal resonator plate 2. Regarding the configuration of the present invention, however, the above configuration is similar to that of the above embodiment, providing similar advantageous effects.

In addition to the crystal resonator plate 2, an IC chip may be mounted on the base 4 according to this embodiment to implement an oscillator. Mounting an IC chip on the base 4 involves formation of electrodes on the base 4 in conformity of the electrode configuration of the IC chip.

Figure 35:
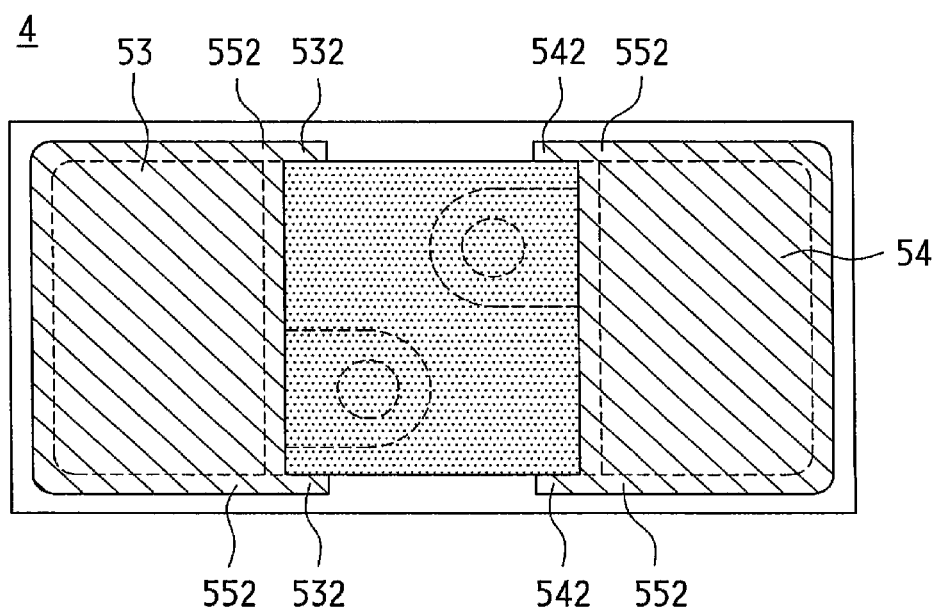
FIG. 35 is a schematic rear view of a base according to another embodiment.

The shapes of the external terminal electrodes 53 and 54 of the base 4 according to this embodiment are not limited to the shapes shown in FIG. 3. The external terminal electrodes 53 and 54 may also be shaped as shown in FIG. 35. In the configuration shown in FIG. 35, electrode portions (extending portions 532 (542)) extend from the external terminal electrode 53 or 54 along the longer side direction of the base 4 toward the opposing external terminal electrode 53 or 54. The extending portions 532 and 542 extend from two corner portions at the opposing sides of the respective external terminal electrodes 53 and 54. The extending portions 532 and 542 enlarge the area of adhesion of the external terminal electrodes 53 and 54 with respect to the base material of the base 4. Further, the extending portions 532 and 542 are disposed adjacent to the bonding portion (disposed at the areas 552) at which the external terminal electrodes 53 and 54 are bonded to the resin pattern 61. This advantageously provides a complement to the adhesion between the external terminal electrodes 53 and 54 and the resin pattern 61, which are otherwise difficult to bond to each other. While the extending portions 532 and 542 shown in FIG. 35 extend along the longer side direction of the base 4, this should not be construed in a limiting sense. The extending portions 532 and 542 may extend along the shorter side direction of the base 4 from the two corner portions of the respective external terminal electrodes 53 and 54. The extending portions 532 and 542 may also extend along the longer side direction and the shorter side direction of the base 4 from the two corner portions of the respective external terminal electrodes 53 and 54.

Figure 36:
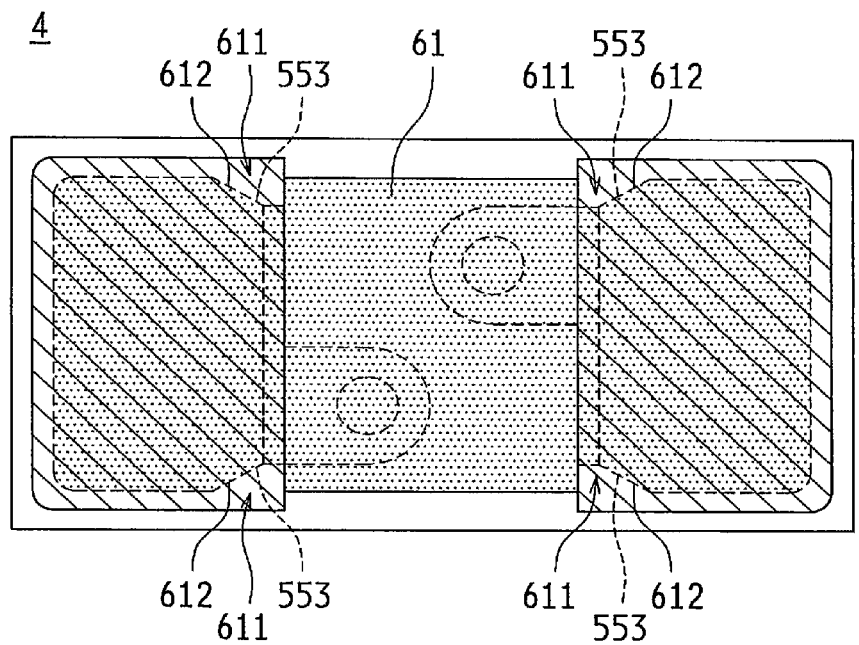
FIG. 36 is a schematic rear view of a base according to another embodiment.

While in this embodiment the resin pattern 61 has a rectangular shape in plan view, this should not be construed in a limiting sense. As shown in FIG. 36, the resin pattern 61 may have depressed portions 611 that cut into the resin pattern 61. In FIG. 36, for clarity of the depressed portions 611, the resin pattern 61 is dotted including the portions covered by the external terminal electrodes 53 and 54. In the configuration shown in FIG. 36, in addition to the resin pattern 61 having the depressed portions 611 with tapered portions 612, the wiring pattern 55 accords with the shapes of the tapered portions 553. The wiring pattern 55 has tapered portions 553 having the same shapes as the shapes of the tapered portions 612 of the depressed portions 611. Since the tapered portions 612 of the resin pattern 61 and the tapered portions 553 of the wiring pattern 55 have the same shapes, reliability improves with respect to the coupling of the wiring pattern 55 to the external terminal electrodes 53 and 54. The ring-shape parts of the wiring pattern 55 shown in FIG. 36 have a similar configuration as in the embodiment except for the tapered portions 553.

Figure 37:
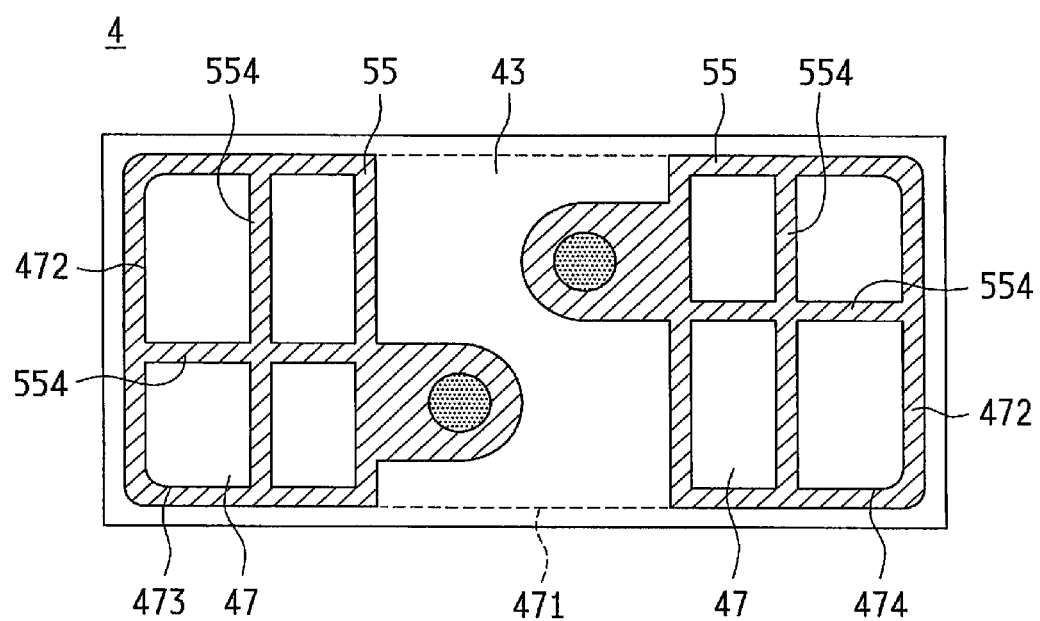
FIG. 37 is a schematic rear view of a base according to another embodiment corresponding to the base shown in FIG. 15.

In this embodiment, parts of the wiring pattern 55 at the side of the other principal surface 43 of the base 4 have ring shapes along both end portions 473 and 474 of the longer side 471 of the resin pattern formed area 47 and the shorter side 472, with the wiring pattern 55 not disposed inside the ring shapes. This, however, should not be construed in a limiting sense. As shown in FIG. 37, lattice-shaped wiring pattern portions 554 (crosswise shapes in FIG. 37) may be disposed in the ring shapes. This improves the electrical resistance of the wiring pattern 55. This, as a result, minimizes deterioration of the electrical resistance even if a disconnection occurs to a part of the wiring pattern 55 or a part of the external terminal electrodes 53 and 54.

Figure 38:
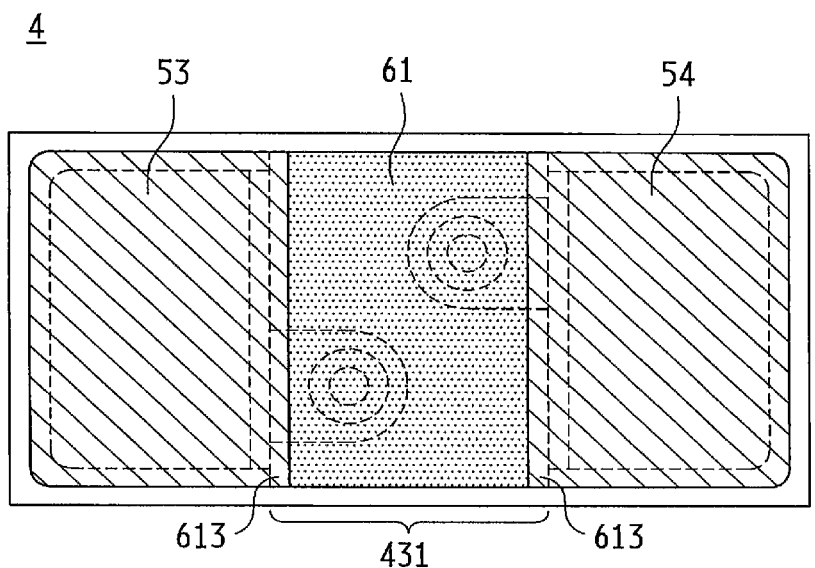
FIG. 38 is a schematic rear view of a base according to another embodiment.

In this embodiment, as shown in FIG. 3, the dimension of the external terminal electrodes 53 and 54 in the width direction (the shorter side direction of the base 4) is longer than the dimension of the resin pattern 61 in the width direction (the shorter side direction of the base 4). This, however, should not be construed in a limiting sense. As shown in FIG. 38, the dimension of the external terminal electrodes 53 and 54 in the width direction may be the same as the dimension of the resin pattern 61 in the width direction. In the configuration shown in FIG. 38, the base 4 is sectioned into three including a center portion 431 where the external terminal electrodes 53 and 54 cover the resin pattern 61. In this configuration, the external terminal electrodes 53 and 54 cover only parts 613 of opposing portions of the exposed resin pattern 61 on the center portion 431, which is one of the three sections of the base 4. Thus, the two external terminal electrodes 53 and 54 provide a complement to the adhesion of the resin pattern 61 to the base material of the base 4. It should be noted that while the external terminal electrode 54 shown in FIG. 38 does not have a cut-out portion 541 (see FIG. 3), this is a mere change in design.

While in this embodiment the crystal resonator 1 used is of two-terminal type, this should not be construed in a limiting sense. It is also possible to use a four-terminal crystal resonator 1 as shown in FIG. 39.

Figure 39:
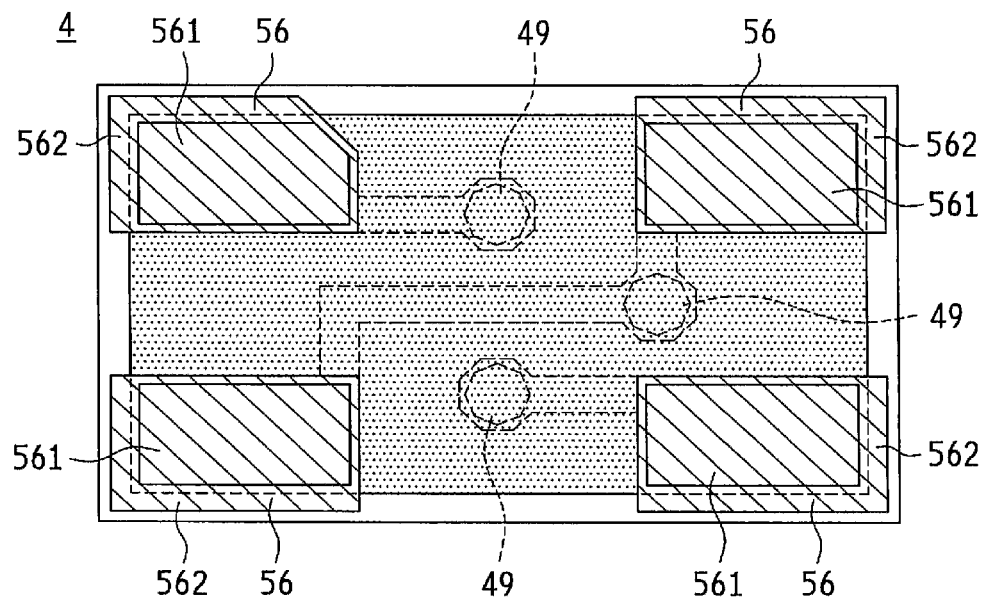
FIG. 39 is a schematic rear view of a base according to another embodiment.

In the four-terminal crystal resonator 1 shown in FIG. 39, four external terminal electrodes 56 are disposed on the base 4. The four external terminal electrodes 56 each have a multiple-layer structure of a plurality of electrode films. In the embodiment shown in FIG. 39, the four external terminal electrodes 56 each include two layers of different areas in plan view (a smaller layer 561 and a larger layer 562), resulting in a stepwise profile. The open ends of the through holes 49 have polygonal shapes (octagonal shapes in the configuration shown in FIG. 39).

In the embodiment shown in FIG. 39, the four external terminal electrodes 56 each have a two-layer configuration of the smaller layer 561 and the larger layer 562. This results in a step portion on each of the four external terminal electrodes 56. This provides an anchor effect at the time of conductive bonding of the crystal resonator 1 on an external part or an external device (specifically, a printed circuit board) with a lead-free solder or the like, thereby improving the reliability of the bonding.

The bonding portion to be bonded to an external part or an external device has a multiple-layer configuration of, in the order from the other principal surface 43 of the base 4: the wiring pattern 55, the resin pattern 61, and the external terminal electrodes 53 and 54. Thus, the bonding portion to be bonded to the printed circuit board has a large distance between the other principal surface 43 of the base 4 and the external terminal electrodes 53 and 54. That is, the bonding portion to be bonded to the printed circuit board is advantageously thick. This configuration acts as a buffer against the stress between the crystal resonator 1 and the printed circuit board. In particular, disposing the resin pattern 61 between the wiring pattern 55 and the external terminal electrodes 53 and 54 more securely provides the buffering effect. As a result, reliability improves with respect to the bonding between the printed circuit board and the bonding portion.

In this embodiment, on the other principal surface 43 of the base 4, the external terminal electrodes 53 and 54 are directly layered over the wiring pattern 55 at the peripheral areas 552 of the resin pattern formed area 47. This, however, should not be construed in a limiting sense. It is also possible to adopt the embodiment shown in FIGS. 40 and 41.

Figure 40:
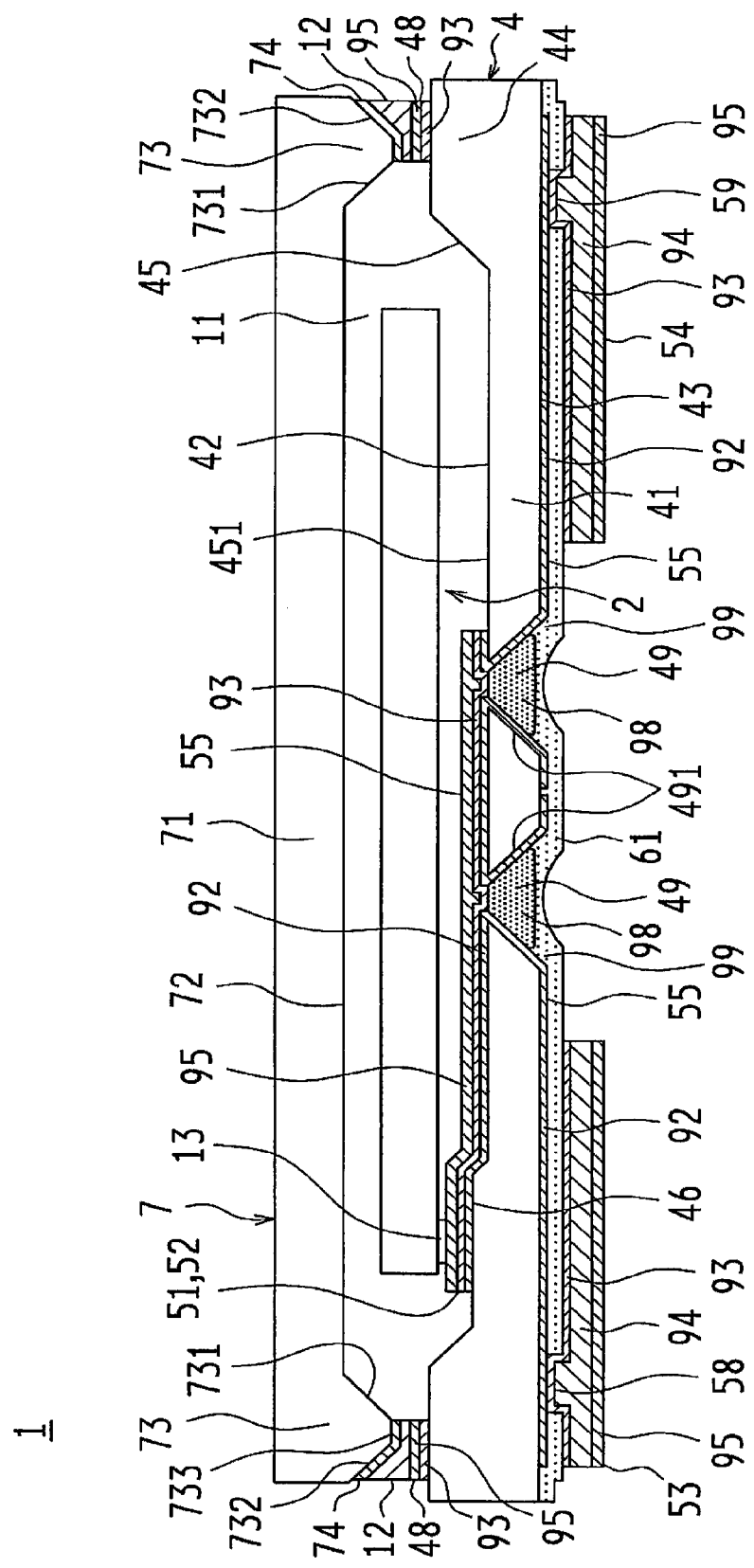
FIG. 40 is a schematic cross-sectional view of a crystal resonator according to another embodiment taken along the line A1-A1 of a base shown in FIG. 41, for schematically illustrating an internal space of the crystal resonator.
Figure 41:
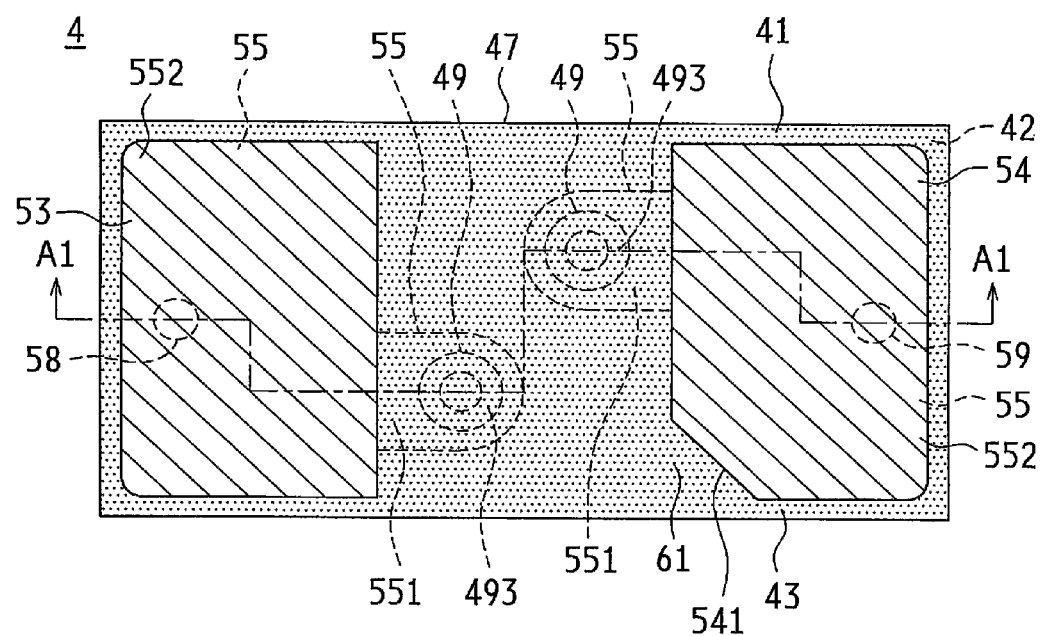
FIG. 41 is a schematic plan view of the base according to another embodiment.

In the embodiment shown in FIGS. 40 and 41, the external terminal electrodes 53 and 54 are not directly layered over the wiring pattern 55 at the peripheral areas 552 of the resin pattern formed area 47. Instead, the resin pattern formed area 47 has contact areas 58 and 59 respectively for the external terminal electrodes 53 and 54 to contact the wiring pattern 55. At the contact areas 58 and 59, the external terminal electrodes 53 and 54 contact (are layered over) the wiring pattern 55. That is, the external terminal electrodes 53 and 54 are electrically coupled to the wiring pattern 55 at the contact areas 58 and 59.

Also in the embodiment shown in FIGS. 40 and 41, the wiring pattern 55 extends from the one principal surface 42 of the base 4 through the internal surfaces 491 of the through holes 49 to the other principal surface 43 of the base 4 so as to electrically couple the electrode pads 51 and 52 to the external terminal electrodes 53 and 54. The resin pattern 61 is disposed over the entire other principal surface 43 of the base 4 excluding the contact areas 58 and 59.

In the embodiment shown in FIGS. 40 and 41, the resin pattern formed area 47 has one contact area 58 and one contact area 59. This, however, should not be construed as limiting the number of the contact areas 58 and 59. Any number of contact areas 58 and 59 may be disposed in the resin pattern formed area 47 (under the layers of the external terminal electrodes 53 and 54).

Figure 42:
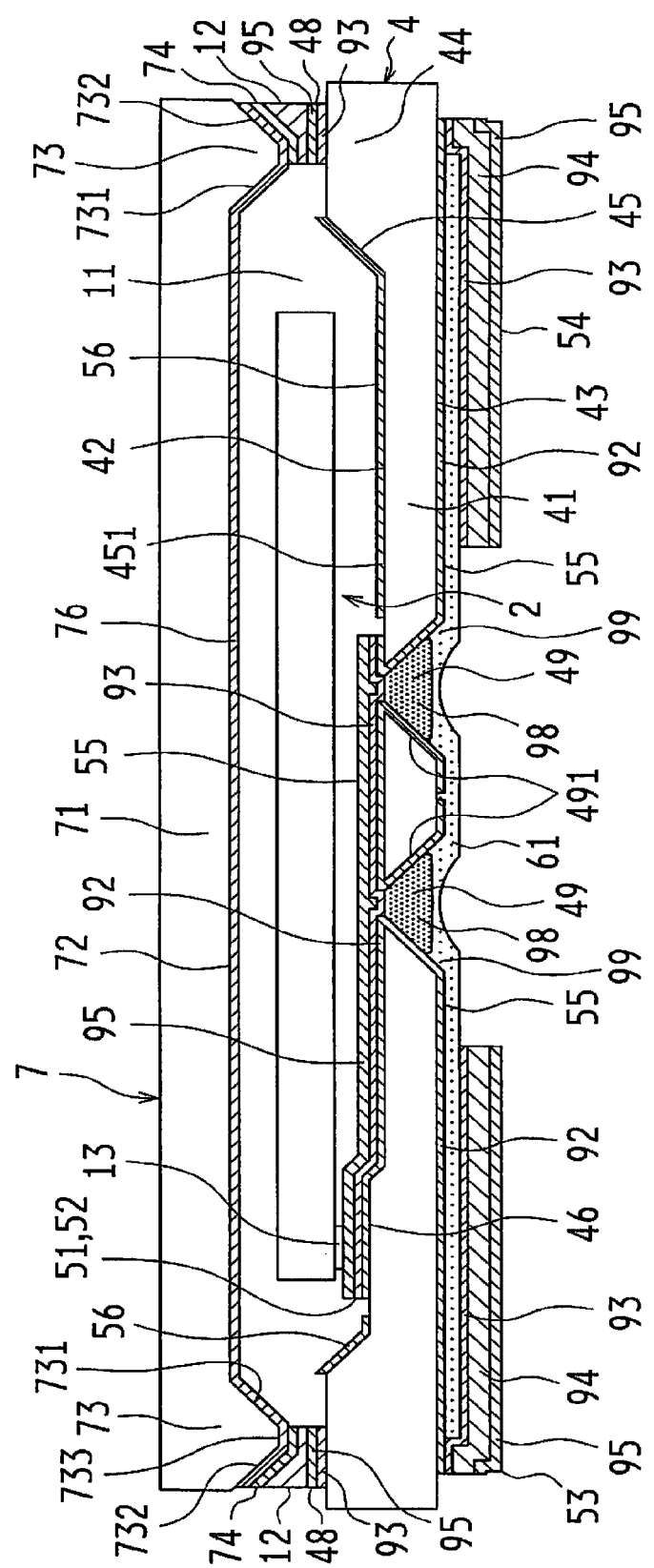
FIG. 42 is a schematic cross-sectional view of a crystal resonator according to another embodiment taken along the line A2-A2 of a base shown in FIG. 43, for schematically illustrating an internal space of the crystal resonator.
Figure 43:
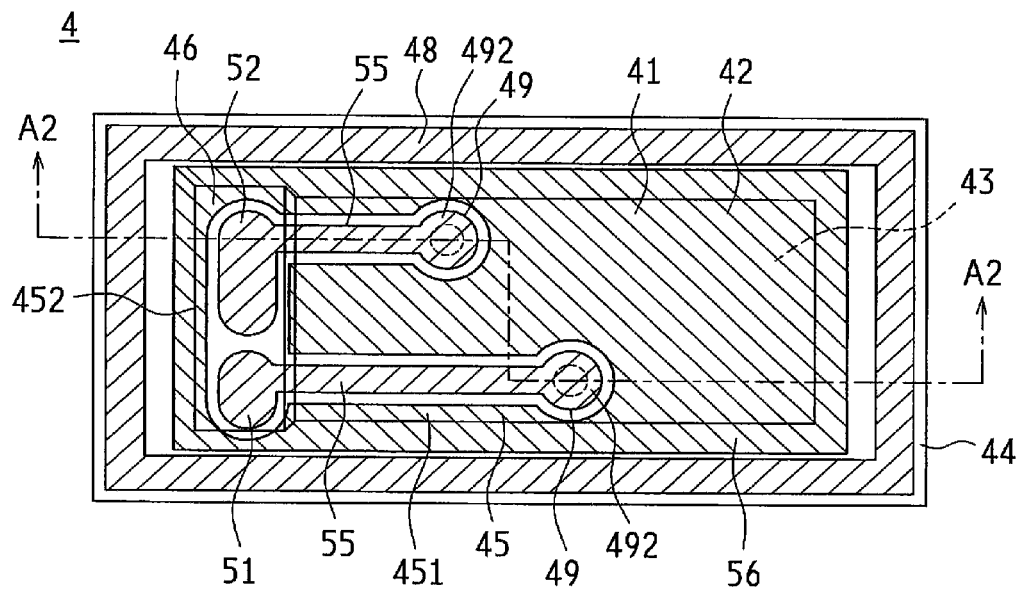
FIG. 43 is a schematic plan view of the base according to another embodiment.
Figure 44:
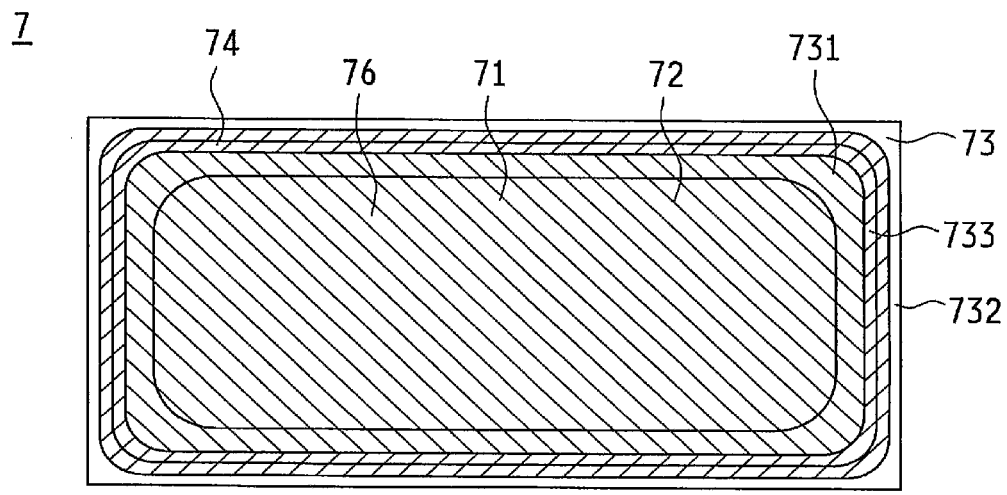
FIG. 44 is a schematic rear view of a lid according to another embodiment.

The crystal resonator 1 according to this embodiment may include a getter material. FIGS. 42, 43, and 44 show a crystal resonator 1 including a getter material.

In the embodiment shown in FIGS. 42, 43, and 44, a getter film 56 made of getter material is disposed on the one principal surface 42 of the base 4; specifically, on the bottom face and the wall face of the cavity 45 including the pedestal portion 46. The getter film 56 includes a Ti film formed by sputtering on the base material of the base 4 (see reference numeral 931 in FIG. 1). In this embodiment, the getter film 56 uses, as its getter material, the same material as the Ti film of the first seed film 92 constituting the electrode pads 51 and 52 and constituting the wiring pattern 55 located at the side of the one principal surface 42 of the base 4. Hence, the getter film 56 is formed by patterning simultaneously with formation of the Ti film of the first seed film 92. The getter film 56 have gaps with respect to the electrode pads 51 and 52 and a part of the wiring pattern 55. This prevents short circuiting between the getter film 56 and the electrode pads 51 and 52 and a part of the wiring pattern 55.

A getter film 76 is disposed on the one principal surface 72 of the lid 7 facing the internal space 11; specifically, on the entire portion of the top portion 71 facing the internal space 11 and on the entire the internal surface 732 of the wall portion 73. The getter film 76 includes a Ti film formed by sputtering on the base material of the base 4. While in the embodiment shown in FIGS. 42, 43, and 44 a second bonding layer 74 is disposed over the getter film 76, this should not be construed in a limiting sense. Instead of disposing the second bonding layer 74 over the getter film 76, the getter film 76 may be formed simultaneously with the formation of the Ti film of the second bonding layer 74.

The crystal resonator 1 shown in FIGS. 42, 43, and 44 ensures sufficient mechanical strength of the base material of the base 4 because of the electrode pads 51 and 52 and the wiring pattern 55 covering approximately the entire bottom face 451 and wall face 453 of the cavity 45 including the pedestal portion 46 (that is, the internal electrodes disposed at the side of the principal surface 42 of the base 4) and because of the getter film 56. Likewise, sufficient mechanical strength of the base material of the lid 7 is ensured because of the getter film 76 covering the entire face of the top portion 71 facing the internal space 11 and covering the entire internal surface 732 of the wall portion. As described above, in this embodiment, a Ti film is used in the first seed film 92 constituting the electrode pads 51 and 52, the external terminal electrodes 53 and 54, and the wiring pattern 55 of the base 4 and in the getter films 56 and 76. Ti is a material having high degrees of hardness. In this embodiment, the Ti film has a high degree of thickness (specifically, a thickness of 3000 Å), and this facilitates the attempt to improve the mechanical strength of the base 4 and the lid 7.

It will be readily appreciated that the above-described embodiment and modifications may be combined in any suitable manner.

The present invention can be embodied and practiced in other different forms without departing from the spirit and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A sealing member for a piezoelectric resonator device, constituting a part of a package for hermetically enclosing a piezoelectric resonator plate inside the piezoelectric resonator device and having a first principal surface on which a piezoelectric resonator plate is to be mounted,
    wherein the sealing member comprise:
    a wiring pattern extending from the first principal surface to a second principal surface via an internal face of a through hole formed through a base material constituting the sealing member so as to be coupled to an electrode of the piezoelectric resonator plate, the second principal surface being located opposite the second principal surface;
    an infill layer filling the through hole and sealing the through hole;
    a resin material provided on the second principal surface and covering an opening face of the through hole; and
    an external terminal electrode provided on the second principal surface and electrically coupled to the wiring pattern,
    wherein the resin material is layered over the second principal surface and the wiring pattern, and the external terminal electrode is layered over the wiring pattern and the resin material, and
    wherein the external terminal electrode is layered on the wiring pattern at a peripheral area along and lateral to a peripheral edge of a part of a layered portion of the resin material so that the wiring pattern is in direct contact with an outer peripheral edge of the external terminal electrode, and at least a part of the peripheral edge of the resin material is sandwiched and enclosed by the wiring pattern and the external terminal electrode.

2. The sealing member for a piezoelectric resonator device according to claim 1,
    wherein a conducting material fills at least one through hole passing through between both principal surfaces of the base material, and
    wherein an open end portion of the at least one through hole at a side of the second principal surface is sealed with the resin material.

3. A piezoelectric resonator device comprising: a first sealing member having the one principal surface on which a piezoelectric resonator plate is to be mounted; and a second sealing member opposite the first sealing member, the second sealing member hermetically enclosing an electrode of the piezoelectric resonator plate,
    wherein the first sealing member comprises the first sealing member for piezoelectric resonator device according to claim 1.

4. The sealing member for a piezoelectric resonator device according to claim 1,
    wherein the second principal surface has a resin pattern formed area on which the resin pattern is formed,
    wherein on the second principal surface, the wiring pattern is partially formed along and lateral to a periphery of the resin pattern formed area, and
    wherein the external terminal electrode is formed on a part of the wiring pattern and on the resin pattern.

5. The sealing member for a piezoelectric resonator device according to claim 1,
    wherein the second principal surface has a resin pattern formed area on which the resin pattern is formed, and
    wherein the wiring pattern and the external terminal electrode are layered directly on top of one another at the periphery, and in the resin pattern formed area, the resin pattern has end portions thereof being disposed between the wiring pattern and the external terminal electrode.

6. The sealing member for a piezoelectric resonator device according to claim 2,
    wherein the through holes have therein a gap between the wiring pattern and the resin material.

7. The sealing member for a piezoelectric resonator device according to claim 1,
    wherein a getter film is disposed on the first principal surface of the base material composing the sealing member for a piezoelectric resonator device so that the getter firm has a gap with respect to the wiring pattern.

\* \* \* \* \*